(12) United States Patent
Frattini et al.

(10) Patent No.: US 11,737,376 B2
(45) Date of Patent: Aug. 22, 2023

(54) SUPERCONDUCTING NONLINEAR ASYMMETRIC INDUCTIVE ELEMENT AND RELATED SYSTEMS AND METHODS

(71) Applicant: Yale University, New Haven, CT (US)

(72) Inventors: Nicholas Frattini, New Haven, CT (US); Uri Vool, Somerville, MA (US); Shyam Shankar, New Haven, CT (US); Anirudh Narla, New Haven, CT (US); Katrina Sliwa, New Haven, CT (US); Michel Devoret, New Haven, CT (US); Volodymyr Sivak, New Haven, CT (US)

(73) Assignee: Yale University, New Haven, CT (US)

( * ) Notice: Subject to any disclaimer, the term of this patent is extended or adjusted under 35 U.S.C. 154(b) by 225 days.

(21) Appl. No.: 16/770,942

(22) PCT Filed: Dec. 11, 2018

(86) PCT No.: PCT/US2018/064922
§ 371 (c)(1),
(2) Date: Jun. 8, 2020

(87) PCT Pub. No.: WO2019/118442
PCT Pub. Date: Jun. 20, 2019

(65) Prior Publication Data
US 2021/0021245 A1 Jan. 21, 2021

Related U.S. Application Data

(60) Provisional application No. 62/597,144, filed on Dec. 11, 2017.

(51) Int. Cl.
*H01L 39/02* (2006.01)
*H10N 60/80* (2023.01)
(Continued)

(52) U.S. Cl.
CPC ........... *H10N 60/805* (2023.02); *G06N 10/00* (2019.01); *H10N 60/12* (2023.02); *H10N 69/00* (2023.02)

(58) Field of Classification Search
CPC ......... H03F 19/00; G06N 10/00; H01L 27/18; H01L 39/025; H01L 39/223–226;
(Continued)

(56) References Cited

U.S. PATENT DOCUMENTS

| 3,275,943 A | 9/1966 | Robert |
|---|---|---|
| 3,663,886 A | 5/1972 | Blume |

(Continued)

FOREIGN PATENT DOCUMENTS

| CA | 2 470 845 A1 | 6/2003 |
|---|---|---|
| CN | 1270674 A | 10/2000 |

(Continued)

OTHER PUBLICATIONS

U.S. Appl. No. 15/914,995, filed Mar. 7, 2018, Narla et al.
(Continued)

*Primary Examiner* — Shahed Ahmed
(74) *Attorney, Agent, or Firm* — Wolf, Greenfield & Sacks, P.C.

(57) ABSTRACT

A superconducting device includes two nodes and a Josephson junction coupled between the two nodes, wherein the Josephson junction is characterized by a superconducting phase difference, φ, wherein the superconducting device has a potential that varies as a function of the superconducting phase difference, φ, and has a single potential well. The potential has a non-zero cubic term and quartic term is zero. The Josephson junction may be a single small Josephson junction. The superconducting device may include a superconducting ring connected between the two nodes. The superconducting ring may include a first ring portion with a
(Continued)

plurality of large Josephson junctions connected in series. The superconducting ring may also include a second ring portion that includes the single small Josephson junction in parallel with the plurality of large Josephson junctions between the two nodes.

8 Claims, 8 Drawing Sheets

(51) Int. Cl.
  *G06N 10/00* (2022.01)
  *H10N 60/12* (2023.01)
  *H10N 69/00* (2023.01)

(58) Field of Classification Search
  CPC . H01L 39/2493–2496; H01L 21/76891; H01L 23/49888; H01L 23/53285; H01P 3/081; H03K 19/1954
  See application file for complete search history.

(56) References Cited

U.S. PATENT DOCUMENTS

| | | |
|---|---|---|
| 4,344,052 A | 8/1982 | Davidson |
| 4,403,189 A | 9/1983 | Simmonds |
| 4,585,999 A | 4/1986 | Hilbert et al. |
| 4,956,312 A | 9/1990 | Van Laarhoven |
| 5,105,166 A | 4/1992 | Tsukii et al. |
| 5,254,950 A | 10/1993 | Fan et al. |
| 5,326,986 A | 7/1994 | Miller, Jr. et al. |
| 5,420,100 A | 5/1995 | Vittoria et al. |
| 5,493,719 A | 2/1996 | Smith et al. |
| 5,582,877 A | 12/1996 | Nagamachi et al. |
| 5,635,834 A | 6/1997 | Sloggett et al. |
| 5,661,494 A | 8/1997 | Bondyopadhyay |
| 5,920,811 A | 7/1999 | Suzuki et al. |
| 6,549,059 B1 | 4/2003 | Johnson |
| 6,578,018 B1 | 6/2003 | Ulyanov |
| 6,621,374 B2 | 9/2003 | Higgins et al. |
| 6,627,915 B1 | 9/2003 | Ustinov et al. |
| 6,635,898 B2 | 10/2003 | Williams et al. |
| 6,822,255 B2 | 11/2004 | Tzalenchuk et al. |
| 6,838,694 B2 | 1/2005 | Esteve et al. |
| 6,900,454 B2 | 5/2005 | Blais et al. |
| 6,911,664 B2 | 6/2005 | Il'ichev et al. |
| 6,943,368 B2 | 9/2005 | Amin et al. |
| 7,042,005 B2 | 5/2006 | Il'ichev et al. |
| 7,129,869 B2 | 10/2006 | Furuta et al. |
| 7,253,654 B2 | 8/2007 | Amin |
| 7,307,275 B2 | 12/2007 | Lidar et al. |
| 7,364,923 B2 | 4/2008 | Lidar et al. |
| 7,369,093 B2 | 5/2008 | Oppenländer et al. |
| 7,443,720 B2 | 10/2008 | Astafiev et al. |
| 7,498,832 B2 | 3/2009 | Baumgardner et al. |
| 7,533,068 B2 | 5/2009 | Maassen van den Brink et al. |
| 7,724,083 B2 | 5/2010 | Herring et al. |
| 7,800,395 B2 | 9/2010 | Johnson et al. |
| 7,876,248 B2 | 1/2011 | Berkley et al. |
| 7,899,092 B2 | 3/2011 | Malinovsky |
| 7,932,515 B2 | 4/2011 | Bunyk et al. |
| 8,032,474 B2 | 10/2011 | Macready et al. |
| 8,106,717 B2 | 1/2012 | Ichimura et al. |
| 8,111,083 B1 | 2/2012 | Pesetski et al. |
| 8,138,784 B2 | 3/2012 | Przybysz et al. |
| 8,179,133 B1 | 5/2012 | Kornev et al. |
| 8,234,103 B2 | 7/2012 | Biamonte et al. |
| 8,416,109 B2 | 4/2013 | Kirichenko |
| 8,508,280 B2 | 8/2013 | Naaman et al. |
| 8,514,478 B1 | 8/2013 | Spence |
| 8,922,239 B2 | 12/2014 | Pesetski et al. |
| 9,467,126 B1 | 10/2016 | Naaman et al. |
| 9,892,365 B2 | 2/2018 | Rigetti et al. |
| 9,948,254 B2 | 4/2018 | Narla et al. |
| 10,305,015 B1 | 5/2019 | Brink et al. |
| 11,184,006 B2 | 11/2021 | Wang et al. |
| 11,271,533 B2 | 3/2022 | Narla et al. |
| 2001/0025012 A1 | 9/2001 | Tarutani et al. |
| 2002/0188578 A1 | 12/2002 | Amin et al. |
| 2003/0136973 A1 | 7/2003 | Ogawa et al. |
| 2003/0193097 A1 | 10/2003 | Il'ichev et al. |
| 2004/0059760 A1 | 3/2004 | Ageishi et al. |
| 2004/0077503 A1 | 4/2004 | Blais et al. |
| 2004/0128081 A1 | 7/2004 | Rabitz et al. |
| 2004/0140537 A1 | 7/2004 | Il'ichev et al. |
| 2005/0001209 A1 | 1/2005 | Hilton et al. |
| 2005/0117836 A1 | 6/2005 | Franson et al. |
| 2005/0134377 A1 | 6/2005 | Dent |
| 2005/0224784 A1 | 10/2005 | Amin et al. |
| 2006/0097747 A1 | 5/2006 | Amin |
| 2006/0179029 A1 | 8/2006 | Vala et al. |
| 2007/0174227 A1* | 7/2007 | Johnson ................ B82Y 10/00 706/62 |
| 2007/0215862 A1 | 9/2007 | Beausoleil et al. |
| 2007/0296953 A1 | 12/2007 | Allen et al. |
| 2008/0100175 A1 | 5/2008 | Clark |
| 2008/0274898 A1 | 11/2008 | Johnson et al. |
| 2008/0297230 A1 | 12/2008 | Dzurak et al. |
| 2009/0028340 A1 | 1/2009 | Trifonov |
| 2009/0033369 A1 | 2/2009 | Baumgardner et al. |
| 2009/0074355 A1 | 3/2009 | Beausoleil et al. |
| 2009/0153180 A1 | 6/2009 | Herring et al. |
| 2009/0232191 A1 | 9/2009 | Gupta et al. |
| 2009/0258787 A1 | 10/2009 | Wilkie et al. |
| 2009/0289638 A1 | 11/2009 | Farinelli et al. |
| 2010/0241780 A1 | 9/2010 | Friesen |
| 2010/0246152 A1 | 9/2010 | Lin et al. |
| 2011/0060710 A1 | 3/2011 | Amin |
| 2011/0079889 A1 | 4/2011 | Baillin |
| 2012/0074509 A1 | 3/2012 | Berg et al. |
| 2012/0319085 A1 | 12/2012 | Gambetta et al. |
| 2012/0319684 A1 | 12/2012 | Gambetta et al. |
| 2012/0326130 A1 | 12/2012 | Maekawa et al. |
| 2012/0326720 A1 | 12/2012 | Gambetta et al. |
| 2013/0029848 A1 | 1/2013 | Gonzalez et al. |
| 2013/0043945 A1 | 2/2013 | McDermott et al. |
| 2013/0107352 A1 | 5/2013 | Santori et al. |
| 2013/0196855 A1 | 8/2013 | Poletto et al. |
| 2013/0271265 A1 | 10/2013 | Finn |
| 2014/0167836 A1 | 6/2014 | Gambetta et al. |
| 2014/0176203 A1 | 6/2014 | Matheny et al. |
| 2014/0314419 A1 | 10/2014 | Paik |
| 2015/0028970 A1 | 1/2015 | Chow et al. |
| 2015/0241481 A1 | 8/2015 | Narla et al. |
| 2016/0308502 A1 | 10/2016 | Abdo et al. |
| 2017/0039481 A1 | 2/2017 | Abdo |
| 2017/0193388 A1 | 7/2017 | Filipp et al. |
| 2018/0040935 A1 | 2/2018 | Sliwa et al. |
| 2018/0054165 A1 | 2/2018 | Szöcs et al. |
| 2018/0138987 A1 | 5/2018 | Sliwa et al. |
| 2018/0198427 A1 | 7/2018 | Narla et al. |
| 2018/0232652 A1 | 8/2018 | Curtis et al. |
| 2018/0240035 A1 | 8/2018 | Scheer et al. |
| 2018/0247217 A1 | 8/2018 | Heeres et al. |
| 2018/0247974 A1 | 8/2018 | Oliver et al. |
| 2018/0341874 A1 | 11/2018 | Puri et al. |
| 2019/0020346 A1 | 1/2019 | Wang et al. |
| 2019/0190474 A1 | 6/2019 | Abdo et al. |
| 2020/0258003 A1 | 8/2020 | Rigetti et al. |
| 2020/0287540 A1 | 9/2020 | Smith et al. |
| 2020/0334104 A1 | 10/2020 | Rosenblum et al. |
| 2021/0234084 A1* | 7/2021 | Abdo ..................... H03K 3/38 |
| 2021/0265964 A1* | 8/2021 | Miano ................... H01L 39/025 |
| 2022/0020912 A1* | 1/2022 | Abdo ................... H01L 39/025 |
| 2022/0103172 A1 | 3/2022 | Mundhada et al. |

FOREIGN PATENT DOCUMENTS

| | | |
|---|---|---|
| CN | 101548512 A | 9/2009 |
| CN | 102037475 A | 4/2011 |
| CN | 103778593 A | 5/2014 |
| EP | 0 513 856 A2 | 11/1992 |
| EP | 2 249 173 A1 | 11/2010 |
| EP | 2 264 799 A1 | 12/2010 |

(56) References Cited

FOREIGN PATENT DOCUMENTS

| | | |
|---|---|---|
| GB | 1 370 647 A | 10/1974 |
| JP | S61-067304 A | 4/1986 |
| JP | S62-172769 A | 7/1987 |
| JP | S62-172770 A | 7/1987 |
| JP | H06-265612 A | 9/1994 |
| JP | 2-924421 B2 | 7/1999 |
| JP | H11-266153 A | 9/1999 |
| JP | 2001-345488 A | 12/2001 |
| JP | 2004-080129 A | 3/2004 |
| JP | 2006-344761 A | 12/2006 |
| JP | 2012-109652 A | 6/2012 |
| JP | 2013-004717 A | 1/2013 |
| JP | 2014-503890 A | 2/2014 |
| JP | 2016-541146 A | 12/2016 |
| RU | 2 106 717 C1 | 3/1998 |
| RU | 2 212 671 C1 | 9/2003 |
| RU | 2010 124 198 A | 12/2011 |
| WO | WO 2015/102694 A2 | 7/2015 |
| WO | 2017/065856 A1 | 4/2017 |
| WO | WO 2018/182571 A1 | 10/2018 |

OTHER PUBLICATIONS

U.S. Appl. No. 16/068,405, filed Jul. 6, 2018, Wang et al.
Partial Supplementary European Search Report for Application No. EP 14854592.4 dated Mar. 29, 2017.
Extended European Search Report for European Application No. EP 14854592.4 dated Aug. 10, 2017.
International Search Report and Written Opinion for International Application No. PCT/US2014/060694 dated Apr. 2, 2015.
International Preliminary Report on Patentability for International Application No. PCT/US2014/060694 dated Apr. 28, 2016.
Extended European Search Report for European Application No. EP 16756465.7 dated Sep. 28, 2018.
International Search Report and Written Opinion for International Application No. PCT/US2016/019821 dated May 6, 2016.
International Preliminary Report on Patentability for International Application No. PCT/US2016/019821 dated Sep. 8, 2017.
Extended European Search Report for European Application No. EP 16756463.2 dated Sep. 7, 2018.
International Search Report and Written Opinion for International Application No. PCT/US2016/019819 dated May 3, 2016.
International Preliminary Report on Patentability for International Application No. PCT/US2016/019819 dated Sep. 8, 2017.
Extended European Search Report for European Application No. 16780864.1, dated Mar. 5, 2019.
Invitation to Pay Additional Fees for International Application No. PCT/US2016/027817 dated Jun. 3, 2016.
International Search Report and Written Opinion for International Application No. PCT/US2016/027817 dated Aug. 22, 2016.
International Preliminary Report on Patentability for International Application No. PCT/US2016/027817 dated Oct. 26, 2017.
Extended European Search Report for European Application No. 17739044.0, dated Jul. 19, 2019.
International Search Report and Written Opinion for International Application No. PCT/US2017/013426 dated Apr. 5, 2017.
International Preliminary Report on Patentability for International Application No. PCT/US2017/013426 dated Jul. 26, 2018.
International Search Report and Written Opinion for International Application No. PCT/US2018/064922, dated Mar. 8, 2019.
International Preliminary Report on Patentability for International Application No. PCT/US2018/064922, dated Jun. 25, 2020.
Abdo et al., Full coherent frequency conversion between two propagating microwave modes. Phys Rev Lett. Apr. 26, 2013;110:173902.1-5. doi: 10.1103/PhysRevLett. 110.173902.
Abdo et al., Josephson amplifier for qubit readout. Appl Phys Lett. 2011 ;99(16):162506. doi: 10.1063/1.3653473.
Abdo et al., Josephson directional amplifier for quantum measurement of superconducting circuits. Phys Rev Lett. Apr. 25, 2014;112:167701.1-5. doi: 10.1103/PhysRevLett. 112.167701.
Abdo et al., Nondegenerate three-wave mixing with the Josephson ring modulator. Phys Rev B. Jan. 16, 2013;87(1):014508.1-18. doi: 10.1103/PhysRevB.87.014508.
Albert et al., Holonomic quantum computing with cat-codes. Apr. 10, 2015. arXiv:1503.00194v2. 5 pages.
Albert et al., Symmetries and conserved quantities in Lindblad master equations. Phys Rev A. Feb. 2014;89(2):022118. arXiv:1310. 1523v2. 15 pages.
Araujo et al., A LEKID-based CMB instrument design for large-scale observations in Greenland. Proc of SPIE—The International Society for Optical Engineering. Aug. 4, 2014;9153:91530W. doi: 10.1117/12.2056828.
Barends et al., Minimizing quasiparticle generation from stray infrared light in superconducting quantum circuits, Appl Phys Lett. Sep. 13, 2011;99(11):113507.
Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.
Bergeal et al., Phase-preserving amplification near the quantum limit with a Josephson ring modulator. Nature. May 2010;465(7294):64-8. arXiv:0912.3407v1. 20 pages.
Bergeal et al., Phase-preserving amplification near the quantum limit with a Josephson ring modulator. Nature. 2010;465:64-9.
Bianchetti et al., Dynamics of dispersive single qubit read-out in circuit quantum electrodynamics. Phys. Rev. A. Oct. 30, 2009;80:043840.
Bockstiegel et al., Development of broadband NbTiN traveling wave parametric amplifier for MKID readout. J Low Temp Phys. 2014;176:476-82.
Burgarth et al., Non-Abelian phases from quantum Zeno dynamics. Phys Rev A. Oct. 9, 2013;88:042107.1-5. doi: 10.1103/PhysRevA. 88.042107.
Campagne-Ibarcq et al., Observing quantum state diffusion by heterodyne detection of fluorescence. Phys Rev X. 2016;6:011002.
Campagne-Ibarcq et al., Persistent control of a superconducting qubit by stroboscopic measurement feedback. Phys Rev X. 2013;3:1-7. arXiv:1301.6095v2.
Carollo et al., Coherent Quantum Evolution via Reservoir Driven Holonomy. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.
Castellanos-Beltran et al., Amplification and squeezing of quantum noise with a tunable Josephson metamaterial. Nat Phys. Dec. 2008;4(12):928-31.
Castellanos-Beltran et al., Widely tunable parametric amplifier based on a superconducting quantum interference device array resonator. Applied Physics Letters. 2007;91(8). 4 pages.
Catelani et al., Relaxation and frequency shifts induced by quasiparticles in superconducting qubits, Phys Rev B. 2011;84(6) 064517.
Caves, Quantum limits on noise in linear amplifiers. Phys. Rev. D. 1982;26(8):1817-39.
Chaturvedi et al., Berry's phase for coherent states. J Phys A: Math Gen. 1987;20(16):L1071-5.
Corcoles et al., Protecting superconducting qubits from radiation. App Phys Lett. 2011;99(18):181906.
Court et al., Quantitative study of quasiparticle traps using the single-Cooper-pair transistor. Phys Rev B. 2008;77(10):100501.
Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.
De Lange et al., Reversing quantum trajectories with analog feedback. Phys Rev Lett. 2014;112:080501.
De Ponte et al., Relaxation- and decoherence-free subspaces in networks of weakly and strongly coupled resonators. Ann Phys. Mar. 12, 2007;322:2077-84.
Devoret et al., Superconducting Circuits for Quantum Information: An Outlook. Science. Mar. 8, 2013;339:1169-74. doi: 10.1126/science.1231930.
Dolan, Offset masks for lift-off photoprocessing. App Phys Lett. 1977;31(5):337-9.

(56) References Cited

OTHER PUBLICATIONS

Duan et al., Preserving Coherence in Quantum Computation by Pairing Quantum Bits. Phys Rev Lett. Sep. 8, 1997;79(10-8):1953-6.
Eichler et al., Controlling the dynamic range of a Josephson parametric amplifier. EPJ Quantum Tech. Jan. 29, 2014;1(2). doi:10.1140/epjqt2. 19 pages.
Facchi et al., Quantum Zeno Subspaces. Phys Rev Lett. Aug. 19, 2002;89(8):080401.1-4.
Flurin et al., Superconducting quantum node for entanglement and storage of microwave radiation. Phys Rev Lett. Mar. 6, 2015;114(9):090503. Epub Mar. 4, 2015.
Flurin et al., Generating entangled microwave radiation over two transmission lines. Phys Rev Lett. Nov. 2, 2012;109(18):183901. Epub Oct. 31, 2012.
Frattini et al., 3-wave mixing Josephson dipole element. App Phys Lett. 2017;110:222603-4.
Friedrich et al., Experimental quasiparticle dynamics in a superconducting, imaging x-ray spectrometer, App Phys Lett. 1997;71(26):3901.
Golubov et al., Quasiparticle lifetimes and tunneling times in a superconductor-insulator-superconductor tunnel junction with spatially inhomogeneous electrodes. Phys Rev B Condens Matter. May 1, 1994;49(18):12953-68.
Govenius et al., Parity of measurement of remote qubits using dispersive coupling and photodetection. Phys. Rev. A. Oct. 1, 2015;92(4):042305.
Gueron, Quasiparticles in a diffusive conductor: interaction and pairing, Universite Pierre et Marie Curie—Paris VI. 1997, 241 pages.
Hatridge et al., Dispersive magnetometry with a quantum limited SQUID parametric amplifier. Phys Rev B. Apr. 2011;83(13):134501-1-8.
Hatridge et al., Quantum back-action of an individual variable-strength measurement. Science. Jan. 11, 2013; 339(6116): 178-81. doi: 10.1126/science.1226897.
Heeres et al., Cavity State Manipulation Using Photon-Number Selective Phase Gates. Phys Rev Lett. Sep. 25, 2015;115:137002.1-5. doi: 10.1103/PhysRevLett.115.137002.
Ho Eom et al., A wideband, low-noise superconducting amplifier with high dynamic range. Nature Physics. 2012;8(8):623-7.
Hofheinz et al., Synthesizing arbitrary quantum states in a superconducting resonator. Nature. May 28, 2009;459:546-9. doi:10.1038/nature08005. Supplementary Information. 6 pages.
Houck et al., Life after charge noise: recent results with transmon qubits. Quantum Info Process. Feb. 11, 2009;8(2-3):105-15.
Hover et al., High fidelity qubit readout with the superconducting lowinductance undulatory galvanometer microwave amplifier. Appl Phys Lett. 2014;104;152601.1-4.
Hover et al., Superconducting Low-inductance Undulatory Galvanometer Microwave Amplifier. Appl Phys Lett. Feb. 7, 2012;100:063503.1-3.
Johnson et al., Dispersive readout of a flux qubit at the single photon level. Phys Rev B. 2011;84:220503. arXiv: 1109.2858v2. 5 pages.
Kamal et al., Gain, directionality, and noise in microwave SQUID amplifiers: Input-output approach. Phys Rev B. 2012;86:144510.1-12. doi: 10.1103/PhysRevB.86.144510.
Kamal et al., Noiseless nonreciprocity in a parametric active device. Nature Physics. 2011;7:311-315.
Kamal et al., Signal-to-pump back action and self-oscillation in double-pump Josephson parametric amplifier. Phys. Rev. B. May 13, 2009;79:184301.
Kerckhoff et al., On-chip superconducting microwave circulator from synthetic rotation. Phys Rev Appl. 2015;4:034002. arXiv: 1502.06041. Submitted Feb. 21, 2015. 13 pages.
Kirchmair et al., Observation of quantum state collapse and revival due to the single-photon Kerr effect. Nature. Mar. 14, 2013;495:205-9. doi:10.1038/nature11902.
Knill et al., Theory of Quantum Error Correction for General Noise. Phys Rev Lett. Mar. 13, 2000;84(11):2525-8. arXiv:quant-ph/9908066v1. 6 pages.

Koch et al., Time-reversal symmetry breaking in circuit-QED based photon lattices. arXiv:1006.0762v2. Oct. 11, 2010. 19 pages.
Krastanov et al., Universal Control of an Oscillator with Dispersive Coupling to a Qubit. Phys Rev A. 2015;92:040303. arXiv:1502.08015. Submitted Feb. 27, 2015. 5 pages.
Lähteenmäki et al., Advanced Concepts in Josephson Junction Reflection Amplifiers. Journal of Low Temperature Physics. 2014;175(5-6):868-76.
Leghtas et al., Confining the state of light to a quantum manifold by engineered two-photon loss. Dec. 16, 2014. arXiv:1412.4633v1. 29 pages.
Lidar et al., Decoherence Free Subspaces for Quantum Computation. Phys Rev Lett. Sep. 21, 1998;81(12):2594-7. arXiv:quant-ph/9807004v2. 4 pages.
Lindblad, On the generators of quantum dynamical semigroups. Commun Math Phys. 1976;48(2):119-30.
Liu et al., Comparing and combining measurement-based and driven-dissipative entanglement stabilization. Phys. Rev. X. 2016;6:011022.
Macleod et al., Periodicity in Al/Ti superconducting single electron transistors. App Phys Lett. Aug. 3, 2009;95:052503.
Martinis et al., Calculation of Tc in a normal-superconductor bilayer using the microscopic-based Usadel theory. Nucl Instrum Methods Phys Res A. 2000;444(l)2:23-27.
Martinis et al., Energy decay in superconducting Josephson-Junction qubits from nonequilibrium quasiparticle excitations. Phys Rev Lett. 2009;103(9):097002.
Metelmann et al., Nonreciprocal photon transmission and amplification via reservoir engineering. Phys. Rev. X. 2015(5):021025.
Minev et al., Planar Superconducting Whispering Gallery Mode Resonators. Appl Phys Lett. Oct. 3, 2013;103:142604.1-3. doi: 10.1063/1.4824201.
Mirrahimi et al., Dynamically protected cat-qubits: a new paradigm for universal quantum computation. New J Phys. Apr. 22, 2014;16:045014. 31 pages.
Mousolou et al., Universal non-adiabatic holonomic gates in quantum dots and single-molecule magnets. New J Phys. Jan. 17, 2014;16:013029. 10 pages.
Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.
Murch et al., Observing single quantum trajectories of a superconducting quantum bit. Nature. Oct. 10, 2013;502(7470):211-4. doi: 10.1038/nature12539.
Mutus et al., Design and characterization of a lumped element single-ended superconducting microwave parametric amplifier with on-chip flux bias line. App Phys Lett. Sep. 17, 2013; 103:122602.
Narla et al., Robust concurrent remote entanglement between two superconducting qubits. Phys Rev X. 2016;6:031036.
Narla et al., Wireless Josephson amplifier. Appl Phys Lett. 2014;104:232605. doi: 10.1063/1.4883373. 6 pages.
Nsanzineza et al., Trapping a single vortex and reducing quasiparticles in a superconducting resonator. Phys Rev Lett. Sep. 12, 2014;113(11):117002. Epub Sep. 12, 2014.
O'Brien et al., Resonant Phase Matching of Josephson Junction Traveling Wave Parametric Amplifiers. Phys Rev Lett. Oct. 10, 2014; 113:157001.1-5.
Ofek et al., Demonstrating quantum error correction that extends the lifetime of quantum information. Nature. 2016;536:441-445.
Oreshkov et al., Adiabatic Markovian Dynamics. Phys Rev Lett. Jul. 30, 2010;105(5):050503. arXiv:1002.2219v4. 7 pages.
Oreshkov et al., Fault-Tolerant Holonomic Quantum Computation. Phys Rev Lett. Feb. 20, 2009;102:070502.1-4.
Oreshkov, Holonomic Quantum Computation in Subsystems. Phys Rev Lett. Aug. 28, 2009;103(9):090502. arXiv:0905.1249v3. 5 pages.
Pachos et al., Decoherence-free dynamical and geometrical entangling phase gates. Phys Rev A. 2004;69:033817. arXiv:quant-ph/0309180v3. 10 pages.
Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.

(56) References Cited

OTHER PUBLICATIONS

Paz-Silva et al., Zeno Effect for Quantum Computation and Control. Phys Rev Lett. Feb. 24, 2012;108(8):080501. arXiv:1104.5507v2. 7 pages.
Peltonen et al., Magnetic-field-induced stabilization of nonequilibrium superconductivity in a normal-metal/insulator/superconductor junction. Phys Rev B. 2011;84(22):220502.
Pillet et al., Optimal design for the Josephson mixer. Mar. 30, 2015. arXiv:1503.08185v1. 5 pages.
Pillet, Amplification, entanglement and storage of microwave radiation using superconducting circuits. University of Virginia. Seminar. 2014;1-78.
Platenberg, Coupled superconducting flux qubits. Delft University of Technology. Thesis. 2007. 153 pages.
Pop et al., Coherent suppression of electromagnetic dissipation due to superconducting quasiparticles. Nature. Apr. 17, 2014;508(7496):369-72. doi: 10.1038/nature13017.
Ranzani et al., Graph-based analysis of nonreciprocity in coupled-mode systems. New J Phys. Oct. 15, 2014;17:023024. arXiv 2014;1406.4922v2. 21 pages.
Rigetti et al., Superconducting qubit in a waveguide cavity with a coherence time approaching 0.1 ms. Phys Rev B. 2012;86:100506.
Ristè et al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.
Ristè et al., Millisecond charge-parity fluctuations and induced decoherence in a superconducting transmon qubit. Nat Commun. 2013;4:1913. doi: 10.1038/ncomms2936.
Roch et al., Observation of measurement-induced entanglement and quantum trajectories of remote superconducting qubits. Phys Rev Lett. May 2, 2014;112:170501.1-5.
Roch et al., Widely Tunable, Non-degenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.
Sarandy et al., Abelian and non-Abelian geometric phases in adiabatic open quantum systems. Phys Rev A. Jun. 2006;73(6):062101. arXiv:quant-ph/0507012v3. 10 pages.
Schackert et al., A Practical Quantum-Limited Parametric Amplifier Based on the Josephson Ring Modulator. A Dissertation Presented to the Faculty of the Graduate School of Yale University in Candidacy for the Degree of Doctor of Philosophy. Dec. 2013.
Schackert et al., Phase-preserving amplification near the quantum limit with a Josephson ring modulator. Nature. May 2010;465(7294):64-8. arXiv:0912.3407v1. 20 pages.
Schindler et al., Quantum simulation of open-system dynamical maps with trapped ions. Nature Phys. May 19, 2013;9:361-7. arXiv:1212.2418v1. 28 pages.
Segall et al., Dynamics and energy distribution of nonequilibrium quasiparticles in superconducting tunnel junctions. Physical Review B. 2004;70(21):214520.
Shafer, Balanced Amplifier IP3 Improvement. Wayback Machine archive of RF Café, first saved Dec. 5, 2008. https://web.archive.org/web/20081205031826/www.rfcafe.com/references/electrical/balanced-amplifier-ip3-improvement.htm, 2 pages.
Shankar et al., Autonomously stabilized entanglement between two superconducting quantum bits. Nature. Dec. 19, 2013;504(7480):419-22. doi:10.1038/nature12802. Epub Nov. 24, 2013.
Shaw et al., Kinetics of nonequilibrium quasiparticle tunneling in superconducting charge qubits. Phys Rev B. Jul. 1, 2008;78:024503.
Siddiqi et al., An RF-Driven Josephson Bifurcation Amplifier for Quantum Measurements. Phys Rev Lett. Nov. 10, 2004;93:207002. arXiv:cond-mat/0312623v1. 4 pages.
Silveri et al., Theory of remote entaglement via quantum limited phase-preserving amplification. Phys Rev A. Jun. 7, 2016;93:062310.
Sirois et al., Coherent-state storage and retrieval between superconducting cavities using parametric frequency conversion. Appl Phys Lett. Apr. 30, 2015;106:172603.
Sjöqvist, Trends: A new phase in quantum computation. Phys. 2008;1:35. doi:10.1103/Physics.1.35. 6 pages.
Sliwa et al., Reconfigurable Josephson Circulator/Directional Amplifier. Phys. Rev. X 2015;5:041020.
Smith et al., Low noise papametric amplifier. IEEE Transactions on Magnetics. Mar. 1985;MAG-21(2): 1022-8.
Spietz et al., Input Impedance and Gain of a Gigahertz Amplifier Using a DC SQUID in a Quarter Wave Resonator. Appl Phys Lett. Jun. 17, 2008;93:082506. arXiv:0806.2853v1. 4 pages.
Sun et al., Measurements of Quasiparticle Tunneling Dynamics in a Band-Gap-Engineered Transmon Qubit. Phys Rev Lett. Jun. 8, 2012;108:230509. doi: 10.1103/PhysRevLett.108.230509.
Sun et al., Tracking photon jumps with repeated quantum non-demolition parity measurements. Nature. Jul. 24, 2014;511(7510):444-8. doi: 10.1038/nature13436. Epub Jul. 13, 2014.
Swenson et al., High-speed phonon imaging using frequency-multiplexed kinetic inductance detectors,. App Phys Lett. Jul. 1, 2010; 96:263511.
Usadel, Generalized Diffusion Equation for Superconducting Alloys. Phys Rev Lett. 1970;25(8):507.
Vijay et al., Invited Review Article: The Josephson bifurcation amplifier. Rev Sci Instrum. Nov. 17, 2009;80:111101. doi: 10.1063/1.3224703.
Vijay et al., Observation of Quantum Jumps in a Superconducting Artificial Atom. Phys Rev Lett. Mar. 18, 2011;106(11):110502.1-4.
Vijay et al., Quantum feedback control of a superconducting qubit: Persistent Rabi oscillations. Nature. Oct. 4, 2012;490(7418):77-80. doi: 10.1038/nature11505.
Vion et al., Manipulating the quantum state of an electrical circuit. Science. May 3, 2002;296(5569):886-9.
Visser et al., Fluctuations in the electron system of a superconductor exposed to a photon flux. Nat Commun. 2014;5:3130. doi: 10.1038/ncomms4130.
Vool et al., Non-Poissonian quantum jumps of a fluxonium qubit due to quasiparticle excitations. Phys Rev Lett. Dec. 12, 2014;113(24):247001. Epub Dec. 8, 2014.
Wang et al., A Schrödiner cat living in two boxes. Science. May 27, 2016;352(6289):1087.
Wang et al., Measurement and control of quasiparticle dynamics in a superconducting qubit, Nature Comms. Dec. 18, 2014; 5:5836. doi:10.1038/ncomms6836.
Wang, Memristors and Superconducting Quantum Interference Filters in RF Systems. Department of Electrical and Computer Engineering, Duke University. Thesis. Aug. 18, 2014. 119 pages.
Wendin et al., Superconducting quantum circuits, qubits and computing. arXiv:cond-mat/0508729v1. Aug. 30, 2005. 60 pages.
Wenner et al., Excitation of superconducting qubits from hot nonequilibrium quasiparticles. Phys Rev Lett. Apr. 12, 2013;110(15):150502. Epub Apr. 9, 2013.
Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17):170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301. 1-9. doi: 10.1103/PhysRevB.87.144301.
Yamamoto et al., Flux-driven Josephson parametric amplifier. Appl Phys Lett Jul. 2008;93:042510. doi:10.1063/1.2964182.
Zanardi et al., Coherent quantum dynamics in steady-state manifolds of strongly dissipative systems. Phys Rev Lett. Dec. 17, 2014;113:240406. arXiv:1404.4673. 6 pages.
Zanardi et al., Geometry, robustness, and emerging unitarity in dissipation-projected dynamics. Phys Rev A. 2015;91:052324. arXiv:1412.6198. 8 pages.
Zanardi et al., Holonomic Quantum Computation. Phys Lett A. Nov. 15, 1999;264:94-9. 5 pages.
Zanardi et al., Noiseless Quantum Codes. Phys Rev Lett. Oct. 27, 1997;79(17):3306-9. arXiv:quant-ph/9705044v2. 4 pages.

(56) References Cited

OTHER PUBLICATIONS

Zanardi, Stabilizing Quantum Information. Phys Rev A. Dec. 5, 2000;63(1):012301. arXiv:quant-ph/9910016v2. 5 pages.

Zanardi, Virtual Quantum Subsystems. Phys Rev Lett. Aug. 13, 2001;87(7):077901. arXiv:quant-ph/0103030v2. 4 pages.

Zhang et al., Physical implementation of holonomic quantum computation in decoherence-free subspaces with trapped ions. Phys Rev A. 2006;74:034302. arXiv:quant-ph/0608068v1. 4 pages.

Zheng, Dissipation-induced geometric phase for an atom in cavity QED. Phys Rev A. May 10, 2012;85(5):052106. arXiv:1205.0984v2. 7 pages.

Zheng, Open-system geometric phase based on system-reservoir joint state evolution. Phys Rev A. Jun. 27, 2014;89:062118. arXiv:1405.1227v1. 8 pages.

Zhong et al., Squeezing with a flux-driven Josephson parametric amplifier. New J Phys. Dec. 2013;15:125013. doi:10.1088/1367-2630/15/12/125013.

Zhou et al., High-gain weakly nonlinear flux-modulated Josephson parametric amplifier using a SQUID array. Physical Review. 2014;89(21). 6 pages.

Zhu et al., Geometric quantum gates robust against stochastic control errors. Phys Rev A. Aug. 15, 2005;72(2):020301. arXiv:quant-ph/0407177v1. 4 pages.

Zorin, Josephson Traveling-Wave Parametric Amplifier with Three-Wave Mixing. Phys Rev Applied. Sep. 12, 2016;6:034006.

Zueco et al., Qubit-oscillator dynamics in the dispersive regime: analytical theory beyond the rotating-wave approximation. Physical Review A 80.3 2009. 6 pages.

Reed et al., Entanglement and Quantum Error Correction with Superconducting Qubits. Yale University Dissertation. Dec. 2013:1-368.

Gan et al., Research on the Measurement for Quantum State of Microwave Single Photon in Superconducted Josephson Junction. Journal of Lanzhou University of Arts and Science (Natural Science Edition). Jan. 10, 2015;29(1):22-4, 28.

Didier, The Josephson effect in superconductors and quantum gases. Joseph Fourier University Thesis. Nov. 24, 2009:1-263.

U.S. Appl. No. 17/423,631, filed Jul. 16, 2021, Mundhada et al.

International Search Report and Written Opinion for International Application No. PCT/US2020/013675, dated Mar. 31, 2020.

International Preliminary Report on Patentability for International Application No. PCT/US2020/013675, dated Jul. 29, 2021.

Extended European Search Report for European Application No. 20741852.6, dated Sep. 7, 2022.

Mirrahimi, Cat-qubits for quantum computation. Comptes Rendus Physique. Aug. 1, 2016;17(7):778-87.

Touzard et al., Gated conditional displacement readout of superconducting qubits. Physical review letters. Feb. 25, 2019;122(8):080502.

Yang et al., Ultrastrong-coupling quantum-phase-transition phenomena in a few-qubit circuit QED system. Physical Review A. Apr. 14, 2017;95(4):043823.

\* cited by examiner

SUPERCONDUCTING NONLINEAR ASYMMETRIC INDUCTIVE ELEMENT AND RELATED SYSTEMS AND METHODS

RELATED APPLICATIONS

This application is a national stage filing under 35 U.S.C. § 371 of International Patent Application Serial No. PCT/US2018/064922, filed Dec. 11, 2018, which claims priority to U.S. provisional Application Ser. No. 62/597,144, titled "SUPERCONDUCTING NONLINEAR ASYMMETRIC INDUCTIVE ELEMENT AN RELATED SYSTEMS AND METHODS," filed on Dec. 11, 2017. The contents of these applications are incorporated herein by reference in their entireties.

GOVERNMENT FUNDING

This invention was made with government support under W911NF-14-1-0011 awarded by The United States Army Research Office. The government has certain rights to the invention.

BACKGROUND

Quantum information processing uses quantum mechanical properties to extend the capabilities of information processing. For example, security of information transfer may be enhanced, the amount of information encoded in a communication channel may be increased, and the number of operations required to perform certain computations may be reduced. Just as in conventional information processing where information is stored in one or more bits, quantum information is stored in one or more quantum bits, known as "qubits." A qubit may be implemented physically in any two-state quantum mechanical system, such as photon polarization, electron spin, nuclear spin, or various properties of a superconducting Josephson junction, such as charge, energy, or the direction of a current.

One type of qubit based on the plasma oscillation of a superconducting Josephson junction is a circuit known as a "transmon." Operations on a transmon, such as quantum state initialization, quantum gate operations and quantum measurements, may be implemented by transmitting and receiving microwave photons with the transmon. In such superconducting quantum devices, low-noise, high-gain amplifiers are used to amplify small microwave signals to obtain signals that may be easily detected.

SUMMARY

The following is a non-limiting summary of some embodiments of the present application.

Some embodiments are directed to a superconducting device that includes two nodes and a Josephson junction coupled between the two nodes. The Josephson junction is characterized by a superconducting phase difference, $\varphi$, and the superconducting device has a potential that varies as a function of the superconducting phase difference, $\varphi$, and has a single potential well. The potential has a non-zero $\varphi^3$ term and a $\varphi^4$ term that is equal to zero.

According to some embodiments the Josephson junction is a single small Josephson junction and the superconducting device further includes a superconducting ring connected between the two nodes. The super conducting ring includes a first ring portion comprising a plurality of large Josephson junctions connected in series, wherein each large Josephson junction of the plurality of large Josephson junctions has the same tunneling energy; and a second ring portion comprising the single small Josephson junction in parallel with the plurality of large Josephson junctions between the two nodes, wherein the single small Josephson junction has a tunneling energy less than the tunneling energy of each large Josephson junction.

According to some embodiments a magnetic flux generation device positioned in proximity to the superconducting ring and configured to generate an external DC magnetic flux through the superconducting ring.

According to some embodiments the plurality of large Josephson junctions consists of three large Josephson junctions.

According to some embodiments the three large Josephson junctions are formed from two Dolan bridges.

According to some embodiments a tunneling energy of the single small Josephson junction is less than a tunneling energy of each individual large Josephson junction.

According to some embodiments the tunneling energy of each individual large Josephson junction is $E_J$, the time, the tunneling energy of the single small Josephson junction is $\alpha E_J$, where $\alpha$ is less than 0.50 and greater than 0.20.

According to some embodiments $\alpha$ is approximately equal to 0.29 and the external DC magnetic flux is 0.41 $\Phi_0$, where $\Phi_0$ is the magnetic flux quantum.

Some embodiments are directed to a parametric amplifier that includes a superconducting amplifier ring comprising: four superconducting nonlinear asymmetric inductive elements (SNAIL); an idler node coupled between a first SNAIL and a second SNAIL; a microstrip line coupled between the second SNAIL and a third SNAIL; a pump node coupled between the third SNAIL and a fourth SNAIL; and a signal node coupled between the fourth SNAIL and the first SNAIL.

According to some embodiments a magnetic flux generation device positioned in proximity to the superconducting amplifier ring and configured to generate an external DC magnetic flux through the superconducting amplifier ring.

Some embodiments are directed to a low-noise directional amplifier comprising two parametric amplifiers, the low-noise directional amplifier including: a first port and a second port; a first coupler and a second coupler, wherein the first port and the second port are coupled to the first coupler; a first parametric amplifier connected to the first coupler and the second coupler; and a second parametric amplifier connected to the first coupler and the second coupler, in parallel with the first parametric amplifier.

According to some embodiments the first port is an input port configured to receive at least one input signal and the second port is an output port configured to output at least one signal.

According to some embodiments the low-noise directional amplifier further includes a third port coupled to a cold load and a fourth port coupled to a cold load.

According to some embodiments the first coupler is a 3 dB coupler.

According to some embodiments a reflection gain amplitude of the first parametric amplifier is the same as a reflection gain amplitude of the second parametric amplifier and a transmission gain amplitude is the same as a transmission gain amplitude of the second parametric amplifier.

According to some embodiments the reflection gain amplitude of the first parametric amplifier is greater than or equal to unity and less than the reciprocal of a transmission amplitude of the second coupler.

According to some embodiments a phase of a pump signal of the first parametric amplifier is different from a phase of a pump signal of the second parametric amplifier.

According to some embodiments the difference between the phase of the pump signal of the first parametric amplifier and the phase of the pump signal of the second parametric amplifier is $\pi/2$ radians.

According to some embodiments the difference between the phase of the pump signal of the first parametric amplifier and the phase of the pump signal of the second parametric amplifier determines whether the low-noise directional amplifier is non-reciprocal.

According to some embodiments a transmission of a signal from the first port to the second port is substantially 100% when no pumps are applied to the first parametric amplifier and the second parametric amplifier.

According to some embodiments the low-noise directional amplifier is non-reciprocal and does not include a circulator.

According to some embodiments the low-noise directional amplifier is at least part of an integrated circuit.

Some embodiments are directed to a superconducting circuit that includes: a SNAIL; a first cavity supporting a first microwave mode with a first frequency, wherein the first cavity is coupled to the SNAIL; and a second cavity supporting a second microwave mode with a second frequency, wherein the second cavity is coupled to the SNAIL. The SNAIL is configured to be pumped at a pump frequency such that when the pump frequency is equal to the difference between the first frequency and the second frequency the first microwave mode of the first cavity couples to the second microwave mode of the second cavity.

According to some embodiments the first cavity and the second cavity are each capacitively coupled to the superconducting device.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1A:
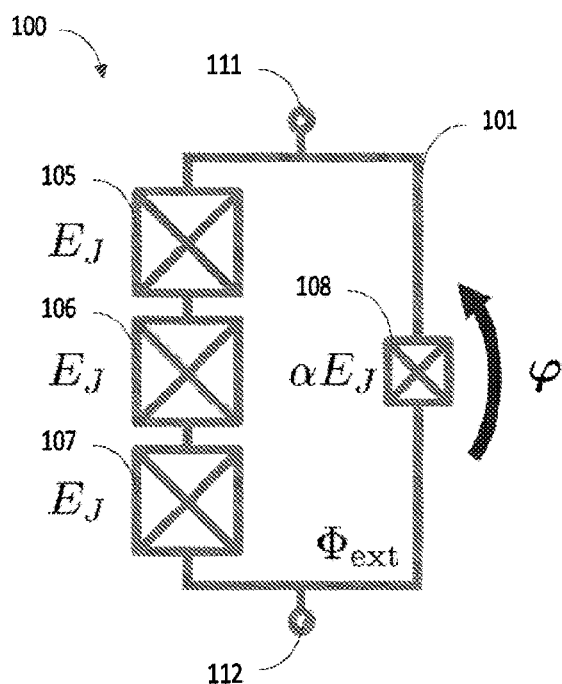
FIG. 1A is a schematic diagram of a superconducting nonlinear asymmetric inductive element (SNAIL), according to some embodiments.

The inventors have recognized that Josephson junctions provide a nonlinear interaction between electromagnetic modes which is purely dispersive. Such interactions are useful for engineering particular types of quantum operations that can be used to control and measure qubits in quantum information processing system. The inventors have recognized, however, that the Josephson potential is an even function of the superconducting phase difference $\varphi$, making the nonlinearity, to the lowest order, of the form $\varphi^4$. While an interaction based on such a nonlinearity may be used to create useful interaction in a quantum information processing system, this type of nonlinearity imparts a frequency shifts that are undesirable in many quantum information processing contexts. Thus, the inventors have recognized that a device with cubit nonlinearity and no quartic interaction term is desirable in some quantum information processing applications.

Certain arrangements of Josephson junctions may create a nonlinear interaction that is cubic, i.e., of the form $\varphi^3$. Such nonlinearities have been realized in a device called a Josephson ring modulator (JRM), which are formed from four identical Josephson junctions arranged in a Wheatstone-bridge-like configuration. The resulting interaction is governed by a trilinear Hamiltonian term of the form $\varphi_x \varphi_y \varphi_z$ between there modes labelled X, Y, and Z. While the cubic interaction of the JRM may be used to engineer interactions that are useful for quantum information processing, the JRM is a quadrupole circuit element, meaning it imposes a current and phase relationship between four nodes of the circuit.

The inventors have recognized that a dipole circuit element, i.e., a device with two nodes, with a cubic nonlinear interaction would be more modular and simpler to integrate into more complex circuits than a four-node device. For example, connecting a dipole circuit element in series with other dipole circuit elements is straightforward. Similarly, tessellating dipole circuit elements in an array is easier to achieve than tessellating a quadrupole circuit element. Connecting nonlinear circuit elements in series or in a tessellated configuration can improve power handling capabilities and information throughput, which may be desirable in certain quantum information processing applications.

The inventors have further recognized that it would be desirable for a dipole superconducting device that creates a cubic nonlinearity to have a potential with a single potential well to avoid hysteresis effects. Other devices may have double-well potentials, which may prove useful in other contexts, but is not desirable for superconducting devices in some embodiments of the present disclosure.

Accordingly, some embodiments are directed to a superconducting device that includes two nodes and a Josephson junction coupled between the two nodes, wherein the Josephson junction is characterized by a superconducting phase difference, $\varphi$, and the superconducting device has a potential that varies as a function of the superconducting phase difference, $\varphi$, and has a single potential well.

In some embodiments, the potential has a non-zero $\varphi^3$ term and a $\varphi^4$ term that is equal to zero. Because the interaction is cubic, the device is asymmetric in the transformation $\varphi \rightarrow -\varphi$, which is different from devices such as superconducting quantum interference devices (SQUIDs) and superconducting low-inductance undulatory galvanometers (SLUGs). Thus, some embodiments may be referred to as a superconducting nonlinear asymmetric inductive element (SNAIL).

In some embodiments, the Josephson junction is a single small Josephson junction and the superconducting device further includes a superconducting ring connected between the two nodes, the superconducting ring comprising: a first ring portion comprising a plurality of large Josephson junctions connected in series, wherein each large Josephson junction of the plurality of large Josephson junctions has the same tunneling energy; and a second ring portion comprising the single small Josephson junction in parallel with the plurality of large Josephson junctions between the two nodes, wherein the single small Josephson junction has a tunneling energy less than the tunneling energy of each large Josephson junction.

The inventors have further recognized that a nonlinear superconducting nonlinear asymmetric inductive elements (SNAIL) of the type discussed above can be included in a ring like arrangement to form a parametric amplifier.

Accordingly, some embodiments are directed to a parametric amplifier that includes a superconducting amplifier ring that includes four SNAILS. The superconducting amplifier ring further includes an idler node coupled between a first SNAIL and a second SNAIL; a microstrip line coupled between the second SNAIL and a third SNAIL; a pump node coupled between the third SNAIL and a fourth SNAIL; and a signal node coupled between the fourth SNAIL and the first SNAIL.

The inventors have further recognized that conventional dispersive electronic circuits, such as those formed from capacitors and inductors, are reciprocal, meaning an output signal that is re-directed back toward the circuit will follow the same paths as the input signal that created the output signal and be transmitted out the input port. This reciprocal behavior is known in optics as Helmholtz Reciprocity. Reciprocity is a symmetry of a system under the interchange of the source and the observer or, in the case of a circuit with an input and an output port, the interchange of the input port and the output port. The inventors have recognized and appreciated that the reduction of noise in a microwave amplifier for detecting low levels of microwave radiation is limited by the principle of reciprocity since noise coming from the final stages of the circuit may find its way back to the device under study with increased intensity. The problem may be particularly important for measurements done on devices at very low temperatures, as is the case with superconducting qubits, and the final stages of the electronics operate at room temperature, which is how conventional superconducting qubit systems are operated. Consequently, the inventors have recognized and appreciated that placing one or more devices that break the reciprocity of the circuit may be used within the circuit to prevent, by their valve-like properties, noise from the room temperature circuitry reaching the low temperature device. Devices that amplify a signal, and are non-reciprocal are referred to as "directional" amplifiers.

The inventors have further recognized and appreciated that conventional non-reciprocal components in microwave electronics are based on the use of ferrites in high magnetic fields. One example of a ferrite-based non-reciprocal component is a circulator. These components are bulky and may be difficult to incorporate into an integrated circuit. Consequently, it may be difficult to integrate a conventional ferrite-based non-reciprocal component with superconducting qubits on a single chip. Moreover, the magnetic field produced from the ferrites that cause the non-reciprocal behavior may negatively impact the performance of superconducting devices because a material's superconductivity loses many of its useful properties in even a modest magnetic field. Accordingly, the inventors have recognized and appreciated that there is a need for non-reciprocal device where the non-reciprocity is not based on the magnetic field of a ferrite, but instead is created using components that may be formed in an integrated circuit.

The inventors have recognized that placing two parametric amplifiers based on SNAILs between two couplers will transform the phase non-reciprocity of the amplifiers into amplitude non-reciprocity by a phenomenon similar to Mach-Zehnder interference. The resulting low-noise directional amplifier may be used to readout the state of a superconducting qubit. The non-reciprocal nature of this high-fidelity measurement of the qubit isolates the delicate state of the qubit from noise originating from higher stages in the amplification chain.

Accordingly, some embodiments are directed to a low-noise directional amplifier comprising two parametric amplifiers that include SNAILs, the low-noise directional amplifier comprising: a first port and a second port; a first coupler and a second coupler, wherein the first port and the second port are coupled to the first coupler; a first parametric amplifier connected to the first coupler and the second coupler; and a second parametric amplifier connected to the first coupler and the second coupler, in parallel with the first parametric amplifier.

The inventors have further recognized and appreciated that by coupling a SNAIL between two cavities and pumping the SNAIL at the difference frequency between two modes of the cavities a tunable coupling between the two cavities is achieved. Such tunable couplings have many applications in quantum information processing. Using a SNAIL to couple the cavities has the advantage of reducing or eliminating self-Kerr and cross-Kerr terms from the nonlinearity (e.g., by setting the $\varphi^4$ term to zero).

Accordingly, some embodiments are directed a superconducting circuit comprising a SNAIL; a first cavity supporting a first microwave mode with a first frequency, wherein the first cavity is coupled to the SNAIL; and a second cavity supporting a second microwave mode with a second frequency, wherein the second cavity is coupled to the SNAIL. The SNAIL is configured to be pumped at a pump frequency such that when the pump frequency is equal to the difference between the first frequency and the second frequency the first microwave mode of the first cavity couples to the second microwave mode of the second cavity.

FIG. 1A is a schematic diagram of a SNAIL 100, according to some embodiments. The SNAIL 100 includes a superconducting ring 101 with two nodes 111 and 112. There are two path along two different portions of the superconducting ring 101 that connect the first node 111 and the second node 112.

The first ring portion includes multiple Josephson junctions 105-107 connected in series. In some embodiments, there are no other circuit elements between one Josephson junction and the next Josephson junction. For example, a Josephson junction is a dipole circuit element (i.e., it has two nodes). A first node of a first Josephson junction 105 is directly connected to the first node 111 of the SNAIL, which may lead to some other external circuit element (not shown). A second node of the first Josephson junction 105 is directly connected to a first node of a second Josephson junction 106. A second node of the second Josephson junction 106 is directly connected to a first node of a third Josephson junction 107. A second node of the third Josephson junction 107 is directly connected to a second node 112 of the SNAIL, which may lead to some other external circuit element (not shown).

While FIG. 1A illustrates the first ring portion including three Josephson junctions, any suitable number of Josephson junctions greater than one may be used. For example, three, four, five, six, or seven Josephson junctions may be used. Three Josephson junctions are selected for the example shown because three Josephson junctions is the lowest number of Josephson junctions (other than zero or one) that can be formed using a Dolan bridge process of manufacturing, which is used in some embodiments.

In some embodiments, Josephson junctions 105-107 are formed to be identical. For example, the tunneling energies, the critical current, and the size of the Josephson junctions 105-107 are all the same.

The second ring portion of the SNAIL 100 includes a single Josephson junction 108. In some embodiments, there are no other circuit elements in the second ring portion. A first node of a single Josephson junction 108 is directly connected to the first node 111 of the SNAIL, which may lead to some other external circuit element (not shown). A second node of the single Josephson junction 108 is directly connected to the second node 112 of the SNAIL, which may lead to some other external circuit element (not shown).

The single Josephson junction 108 has a smaller tunneling energy than each of Josephson junctions 105-107. For this reason, the single Josephson junction 108 may be referred to as a "small" Josephson junction and Josephson junctions 105-107 may be referred to as "large" Josephson junctions. The terms "large" and "small" are relative terms that are merely used to label the relative size of Josephson junction 108 as compared to Josephson junctions 105-107. The Josephson energy and the Josephson junction size are larger in the large Josephson junction than in the small Josephson junction. The parameter a is introduced to represent the ratio of the small Josephson energy to the large Josephson energy. Thus, the Josephson energy of the large Josephson junctions 105-107 is $E_J$ and the Josephson energy of the small Josephson junction 108 is $\alpha E_J$, where $0 > \alpha < 1$.

Figure 1B:
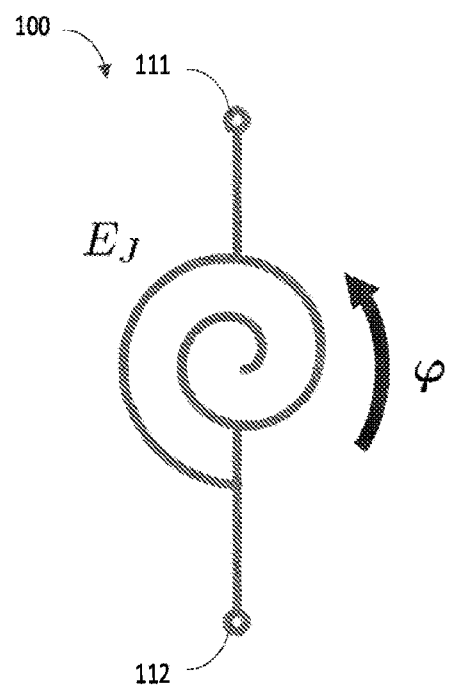
FIG. 1B illustrates the circuit element symbol for the SNAIL of FIG. 1A.

FIG. 1B illustrates the circuit element symbol for the SNAIL 100. The parameters that characterize the SNAIL 100 are the Josephson energy $E_J$ and the superconducting phase difference, $\varphi$, of the small Josephson junction 108. Of note is the fact that the SNAIL 100 has only two nodes 111 and 112.

Figure 1C:
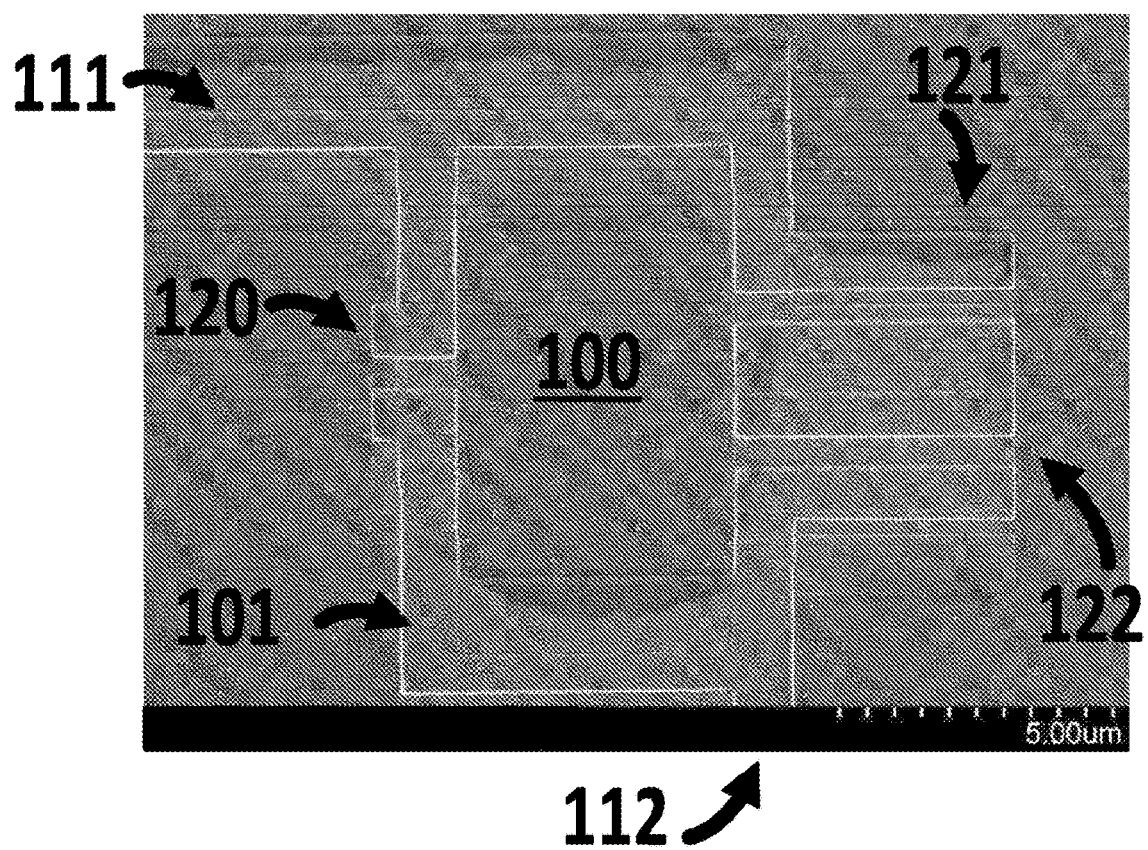
FIG. 1C is an optical microscope image of a SNAIL, according to some embodiments.

FIG. 1C is an optical microscope image of an example SNAIL 100. The image in FIG. 1C is a mirror image of the SNAIL 100 shown in FIG. 1A. In other words, the single small Josephson junction is on the left side in FIG. 1A, not the right side as it is in FIG. 1C. The single small Josephson junction is formed using a single Dolan bridge 120. The three large Josephson junctions 105-107 are formed from a first Dolan bridge 121 and a second Dolan bridge 122. The Dolan bridge fabrication technique has the advantage of being able to reliably fabricate junctions with particular parameters while only requiring a single double-angle evaporation act. If N Dolan bridges are formed in series, 2N−1 Josephson junctions are formed. This is because junctions are formed underneath each bridge and between adjacent bridges. Thus, the simplest way to form a plurality of Josephson junctions using Dolan bridges is to form two Dolan bridges.

The SNAIL 100 may controlled at least in part by threading a DC magnetic flux $\Phi_{ext}$ through the superconducting ring 101. In some embodiments, a magnetic flux generation device (not shown) may be positioned in proximity to the superconducting ring. For example, an electrical coil may be formed in proximity to the ring 101. The coil may be next to the ring 101 and in the same plane as ring 101. Alternatively, a coil may be under the ring 101 in a different layer of the device 100.

As mentioned above, any number of large Josephson junctions may be used in the SNAIL 100. For a SNAIL with n large Josephson junctions, the SNAIL has an inductive energy given by:

$$U_{SNAIL}(\varphi) = -\alpha E_J \cos(\varphi) - n E_J \cos\left(\frac{\varphi_{ext} - \varphi}{n}\right), \quad \text{(Eqn. 1)}$$

where $\varphi$ is the superconducting phase across the single small Josephson junction 108, $\varphi_{ext} = 2\pi \Phi_{ext}/\Phi_0$ is the reduced applied magnetic flux, and $\Phi_0 = h/2e$ is the magnetic flux quantum. Eqn. 1 indicates that the potential is a function of a single degree of freedom ($\varphi$). This is because dynamics due to any intra-array modes are eliminated and only common excitations across the array of n Josephson junctions are considered. This reduction is valid when $E_J \gg E_C$ for each junction, where $E_C = e^2/2C_J$ is the Coulomb charging energy of the junction with capacitance $C_J$, and when $C_0 \ll C_J/n^2$, where $C_0$ is the capacitance to ground of each island between junctions. Some embodiments meet all of these requirements.

In some embodiments, the parameters $\alpha$ and $\Phi_0$ may be selected such that the SNAIL 100 has properties desirable for its application. For example, for $\alpha \sim 0.8$ and $\Phi_{ext} \sim 0.5 \Phi_0$, the SNAIL 100 will have a double-well potential, which is undesirable due to the resulting hysteresis affects. But the parameters can be adjusts to create a potential with a single minimum. Moreover, the potential may simultaneously be tuned to cancel the fourth-order (Kerr) term while keeping a substantial cubic term.

To select desirable parameters, the potential of Eqn. 1 is Taylor expanded about its minimum value $\varphi_{min}$ to obtain the effective potential for $\tilde{\varphi} = \varphi - \varphi_{min}$:

$$\frac{U_{eff}(\tilde{\varphi})}{E_J} = c_2 \tilde{\varphi}^2 + c_3 \tilde{\varphi}^3 + c_4 \tilde{\varphi}^4 + \ldots, \quad \text{Eqn. (2)}$$

where ($c_2$, $c_3$, $c_4$, . . . ) are numerically determinable coefficients whose specific values depend on n (which is three in the illustrated embodiments), $\alpha$, and $\Phi_{ext}$.

In some embodiments, to obtain a pure cubic nonlinearity without any Kerr (e.g., quartic) nonlinearity, the parameters $\alpha$ and $\Phi_{ext}$ are selected such the $c_3 \neq 0$ and $c_4 = 0$. It is noted that for n=1 (e.g., a SQUID) $c_3=0$ because the potential is a pure cosine irrespective of the values of $\alpha$, and $\Phi_{ext}$. Additionally, in the limit n>>1, the array of multiple large Josephson junctions act as a linear inductance and the potential approaches that of a fluxonium qubit/RF SQUID regime. While embodiments may include any number of large Josephson junctions so long as n>1 and the number is not in the regime where n>>1, the example described herein is focused on the case where n=3. Embodiments are not however, limited to this example embodiment.

Figure 2A:
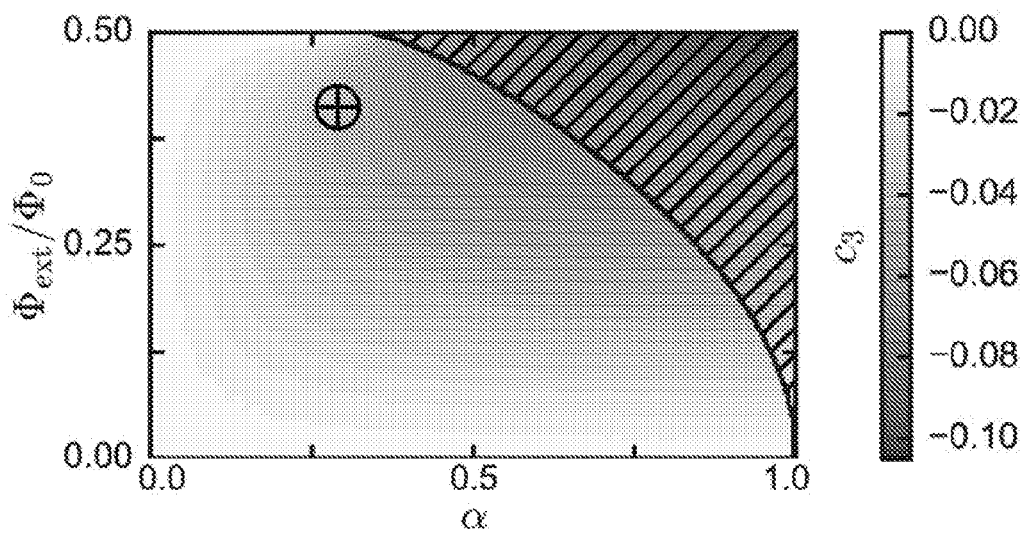
FIG. 2A is a greyscale color map for the third-order phase term, $c_3$, of the potential as a function of the parameter a and the external DC magneric flux, $\Phi_{ext}$, according to some embodiments.
Figure 2B:
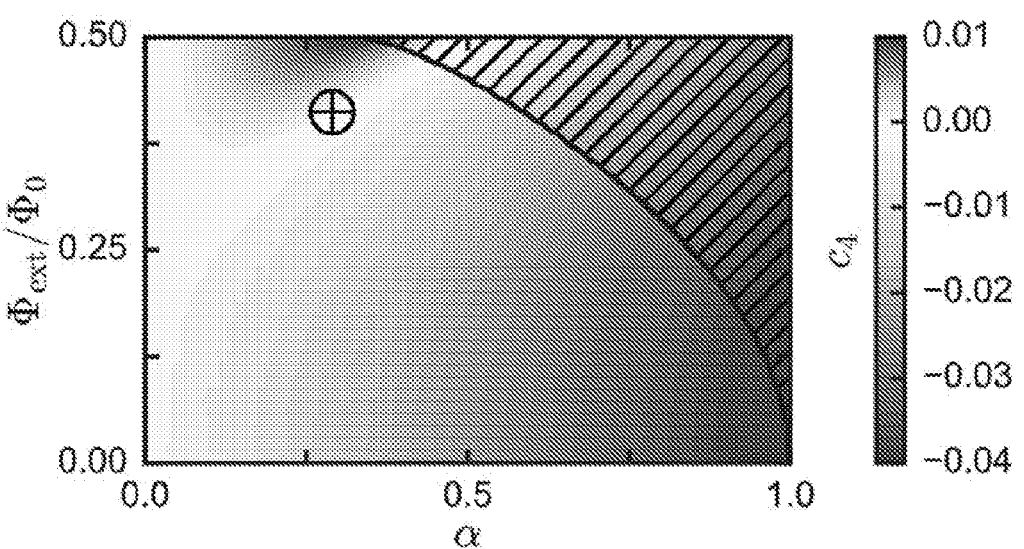
FIG. 2B is a greyscale color map for the fourth-order phase term, $c_4$, of the potential as a function of the parameter a and the external DC magneric flux, $\Phi_{ext}$, according to some embodiments.
Figure 2C:
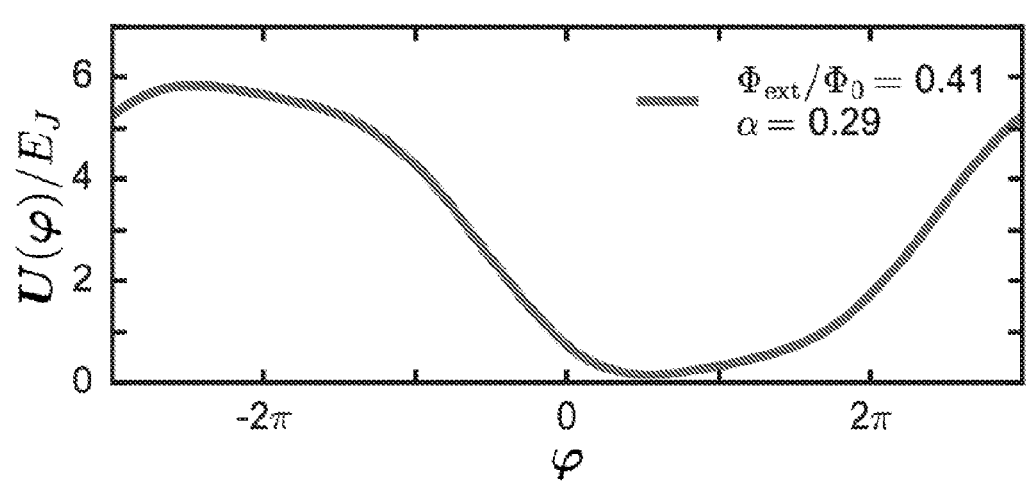
FIG. 2C is a plot of the potential of a SNAIL as a function of a superconducting phase difference of the SNAIL of FIG. 1A, according to some embodiments.

FIG. 2A is a greyscale color map for the third-order phase term, $c_3$, and FIG. 2B is a greyscale color map for the fourth-order phase term, $c_4$, of the potential as a function of the parameter a and the external DC magneric flux, $\Phi_{ext}$ for n=3. These two color maps can be numerically searched to simultaneously obtain two desired criteria. This first criterion is to maximize $c_3$ in FIG. 2A, which correspond to the darker shades of grey. However, any region that corresponds to a hysteretic double-well potential should also be avoided. The black-hatched region of FIG. 2A corresponds to a region where the potential is a double well. In some embodiments, $\alpha$ may be restricted to be less than approximately 0.5 to avoid the black-hatched region. The second criterion is to have $c_4=0$, which corresponds to the white area in FIG. 2C. Thus, some embodiments of a SNAIL have $\alpha$ and $\Phi_{ext}$ selected to maximize $c_3$, set $c_4=0$, and have a potential with a single minimum. One such optimized parameter set found by searching the color maps in FIG. 2A and FIG. 2B is $\alpha=0.29$ and $\Phi_{ext}=0.41\ \Phi_0$. This value of a corresponds to a critical current of $I_0=7.1\ \mu A$ for the large Josephson junctions and a crictical current of $I_0=2.0\ \mu A$ for the single small Josephson junction. This set of parameters is marked by the crosses in FIGS. 2A-B. FIG. 2C is a plot of one period of the $U_{SNAIL}$ potential of Eqn. 1 using this optimized parameter set.

Embodiments need not be limited to an optimized parameters. In some embodiments, $\alpha$ is less than 0.50 and greater than 0.10, $\alpha$ is less than 0.50 and greater than 0.20. $\alpha$ is less than 0.40 and greater than 0.25, $\alpha$ is less than 0.35 and greater than 0.25. In some embodiments, $\Phi_{ext}/\Phi_0$ is less than 0.50 and greater than 0.10, $\Phi_{ext}/\Phi_0$ is less than 0.50 and greater than 0.20, $\Phi_{ext}/\Phi_0$ is less than 0.50 and greater than 0.25, $\Phi_{ext}/\Phi_0$ is less than 0.45 and greater than 0.30. Embodiments may further include any combination of the above ranges of parameters.

Some embodiments are directed to a parametric amplifier that includes at least one SNAIL. In some embodiments, the parametric amplifier may be a non-degenerate three-wave mixing amplifier. The parametric amplifier includes two spatially and spectrally separate modes that are coupled, via one or more nodes, to a superconducting amplifier ring that includes at least one SNAIL. The two modes are coupled by a pump applied at the sum of the frequencies of the two modes. Threading the superconducting amplifier ring with an external DC magnetic flux achieves three-wave coupling between X, Y, and Z modes. Obtaining amplification and frequency conversion while operating in this mode of operation is the explicit signature that a cubic nonlinearity is present.

Figure 3A:
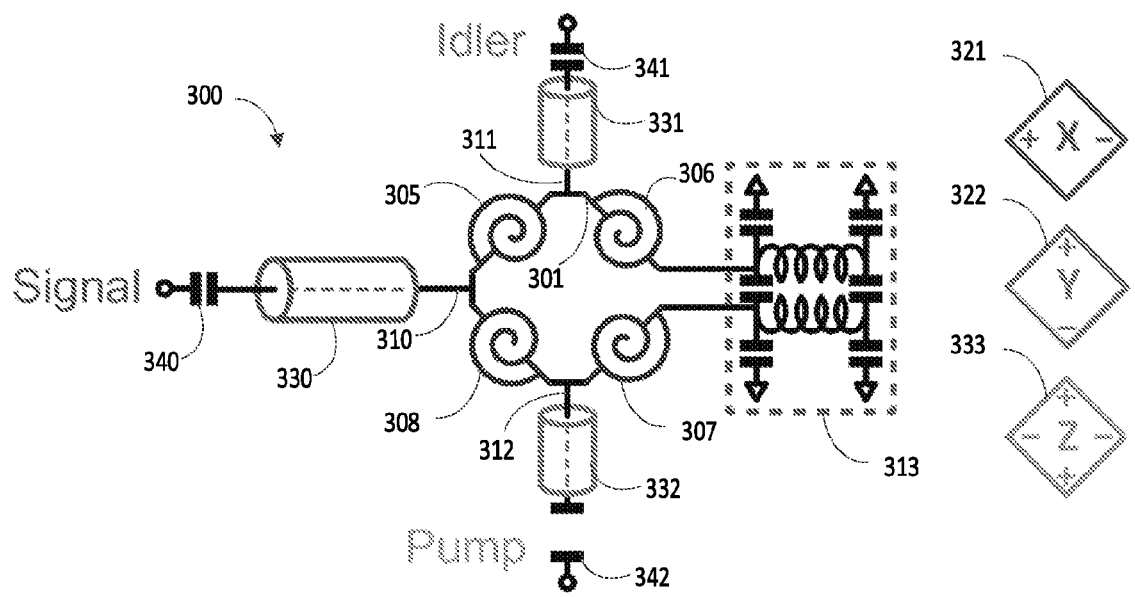
FIG. 3A is a schematic diagram of a parametric amplifier based on the SNAIL of FIG. 1A, according to some embodiments.

FIG. 3A is a schematic drawing of a parametric amplifier 300, according to some embodiments. The parametric amplifier 300 includes a superconducting amplifier ring 301, four SNAILs 305-308, a signal node 310, an idler node 311, a pump node 312, and a microstrip line 313. The SNAILs 305-308 may include any of the embodiments discussed above.

The SNAILs 305-308 are arranged in a Wheatstone-bridge-like arrangement such that each SNAIL is directly connected to at least one other SNAIL and a node or the microstrip line 313. For example, the first SNAIL 305 is in direct contact with the signal node 310 and the idler node 311. The first SNAIL 305 is also in direct contact with the second SNAIL 306 and the fourth SNAIL 308. The second SNAIL 306 is in direct contact with the idler node 311 and the microstrip line 313. The second SNAIL 306 is also in direct contact with the first SNAIL 305. The third SNAIL 307 is in direct contact with the pump node 312 and the microstrip line 313. The third SNAIL 307 is also in direct contact with the fourth SNAIL 306. The fourth SNAIL 308 is in direct contact with the signal node 310 and the pump node 311. The fourth SNAIL 308 is also in direct contact with the first SNAIL 305 and the third SNAIL 307.

The boxes 321-323 represent the X eigenmode 321, the Y eigenmode 322, and the Z eigenmode 323 of the parametric amplifier 300. The + and − signs refer to the relative phase of the voltage across the four SNAILs.

In some embodiments, the parametric amplifier 300 includes a microstrip resonator sections 330-332 coupled to each of the signal node 310, the idler node 311, and the pump node 312. The microstrip resonator sections 330-332 set the frequencies of the signal, idler and pump nodes. The idler mode is the middle frequency mode and is coupled to the Y ring mode 322 of the parametric amplifier 300 via two $\lambda_I/4$ microstrip resonator sections 331 and 332, where $\lambda_I$ is the wavelength of the idler mode. The signal mode is the lowest frequency mode and is coupled to the X ring mode 321 of the parametric amplifier 300 using the microstrip resonator section 330, which is a $\lambda_s/4$ section of microstrip transmition line, where $\lambda_s$ is the wavelength of the signal mode.

In some embodiments, opposed to the microstrip resonator section 330 is an impedance-matched coupled microstrip transmission line 313 has an even mode electrical length that is approximately equal to $\lambda_s/4$ and is open at DC. This structure breaks the exterior loop at DC, but allows radio frequency (RF) coupling to $\varphi_X$. Thus, unlike the ring in a JRM, there is no exterior loop through which a magnetic field is threaded. This is advantageous as it prevents an extra DC persistent current from biasing the SNAILs and facilitates tessellation of the devices without creating a large DC loop.

In some embodiments, gap capacitors 340-342 are used to couple the signal and idler modes to 50Ω transmission lines to set the quality factor Q~150. A small coupling capacitor 342 weakly couples the pump to the Z mode 333 of the parametric amplifier 300 allowing the pump to drive the three-wave mixing process.

In an embodiment where all four SNAILs are identical, the arrangement of SNAILs in the parametric amplifier 300 cancels all the cubic terms in the Hamiltonian except the desired cubic term of $\varphi_X\varphi_Y\varphi_Z$.

In other embodiments, the parametric amplifier 300 may be structured to select other third-order terms. For example, the $\varphi_X^2\varphi_Z$ term for degenerate three-wave mixing may be achieved by inverting the polarity of two opposite SNAILs in the superconducting amplifier ring 301.

Figure 3B:
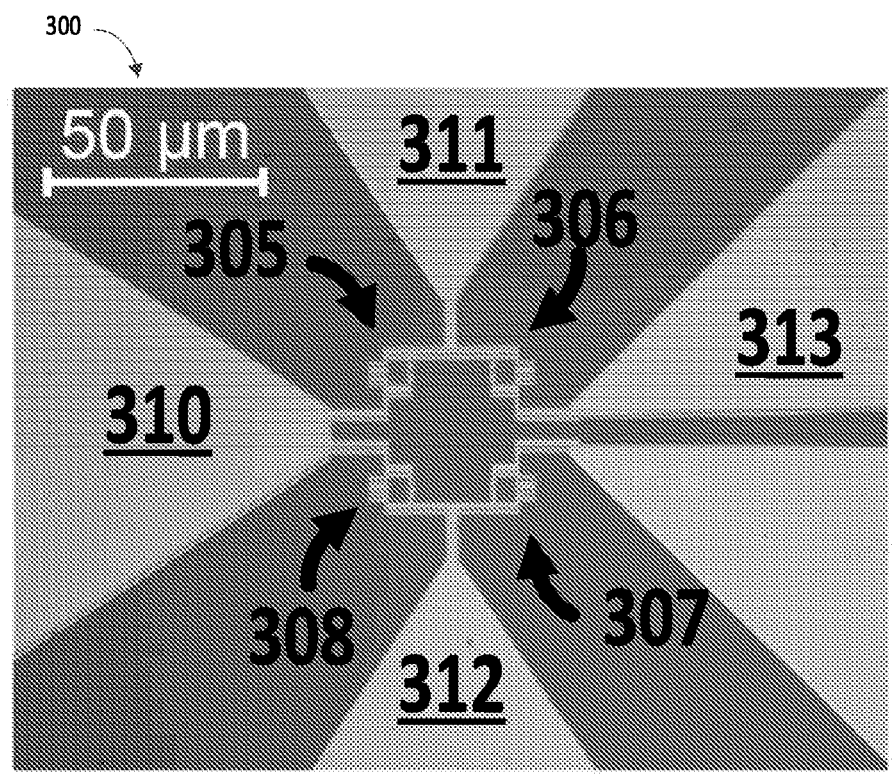
FIG. 3B is an optical microscope image of a parametric amplifier based on the SNAIL of FIG. 1A, according to some embodiments.

FIG. 3B is an optical image of an example parametric amplifier 300. Each of the SNAILs 305-308 is formed using the Dolan bridge process mentioned above. Thus, each of the four SNAILs 305-308 appears similar to the SNAIL 100 shown in FIG. 1C.

To experimentally verify the characteristics of the parametric amplifier 300 that includes four SNAILs 100, the parametric amplifier 300 was mounted at the base stage of a helium dilution refrigerator with access to both the signal and idler ports. A uniform external DC magnetic flux, $\Phi_{ext}$, was applied to each SNAIL by a magnet coil mounted under the sample.

Figure 4:
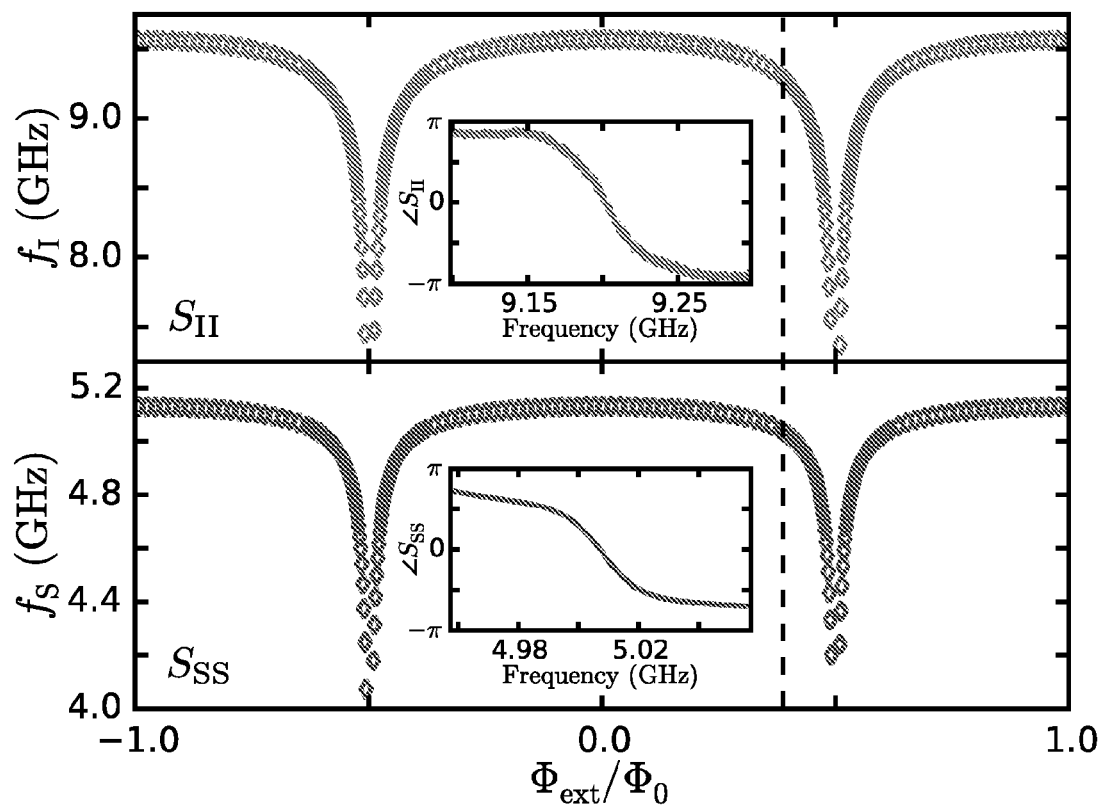
FIG. 4 is a plot of the resonant frequency of the signal and idler modes of a parametric amplifier as a function of the external DC magnetic flux, $\Phi_{ext}$, according to some embodiments.

FIG. 4 is a plot of the resonant frequency $f_S$ ($f_I$) of the signal (idler) mode as a function of external DC magnetic flux, $\Phi_{ext}$, determined through reflection measurements off of the signal (idler) port (examples are shown in the inset, which show the phase of the reflection coefficient at $\Phi_{ext}$=0.41 $\Phi_0$, used to fit resonant frequency at each magnetic flux value). Sweeping $\Phi_{ext}$ in the opposite direction resulted in the same mode frequencies, implying that parametric amplifier 300 is not hysteretic. Thus, the potential does not exhibit double-well behavior and only has a single minimum. The dashed black line corresponds to the calculated optimal flux $\Phi_{ext}$=0.41 $\Phi_0$ for this device with $\alpha$=0.29.

Figure 5:
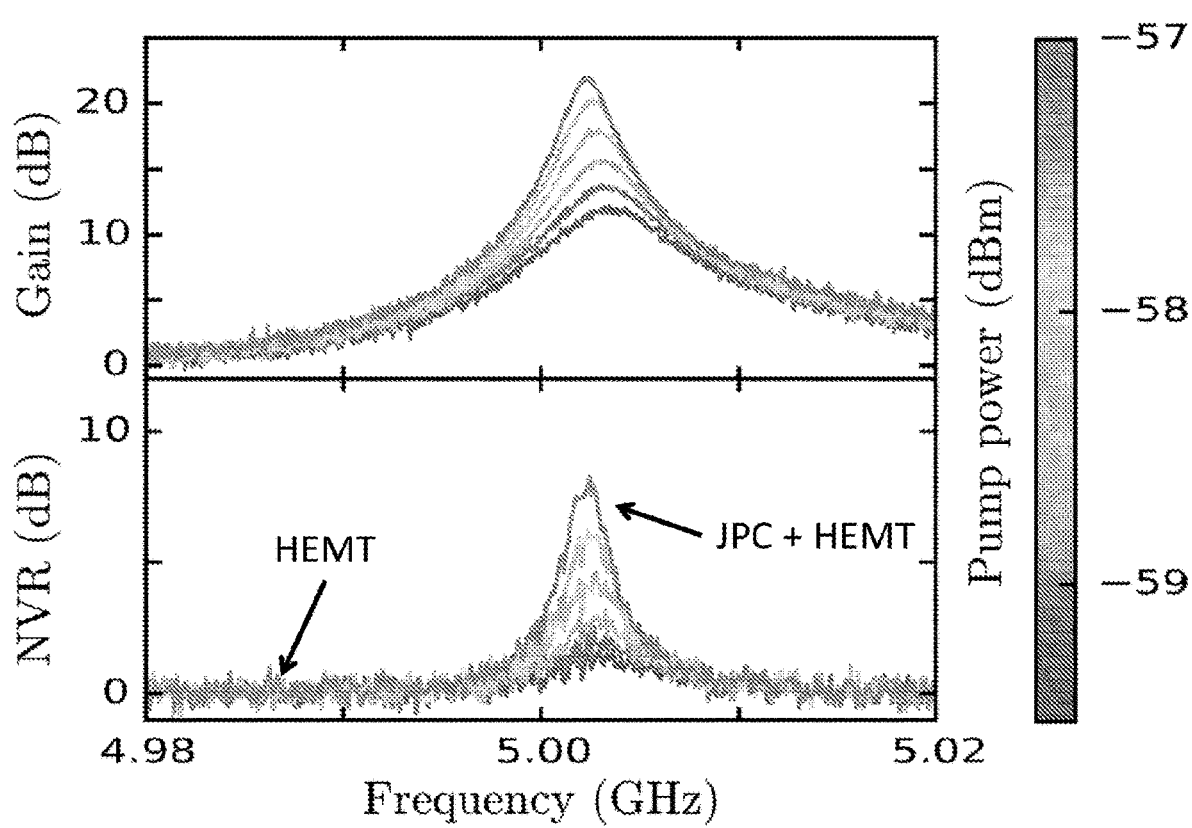
FIG. 5 is a plot of the reflection gain and the Noise Visibility Ratio (NVR) of the idler port of a parametric amplifier, according to some embodiments.

While biasing the parametric amplifier 300 at the optical flux point ($\Phi_{ext}$=0.41 $\Phi_0$), a strong microwave pump tone at frequency $f_P$=$f_S$+$f_I$ is applied on the pump port to drive the parametric amplification process. The top plot of FIG. 5 shows the reflection gain off the signal port. Increasing the pump power results in increased gain and decreased bandwidth. The bottom plot of FIG. 5 shows the Noise Visibility Ratio, a proxy for noise temperature, which is the ratio between the noise power spectral density with the pump on and the pump off (NVR=$P_{on}$/$P_{off}$). The noise temperature of the parametric amplifier 300 can be compared to the noise that is caused by higher stage amplifiers, such as a high electron mobility transistor (HEMT) amplifier. The NVR of the parametric amplifier 300 was similar to that of other quantum-limited amplifiers, indicating that the SNAIL-based amplifier may be used as a quantum-limited amplifier.

Figure 6:
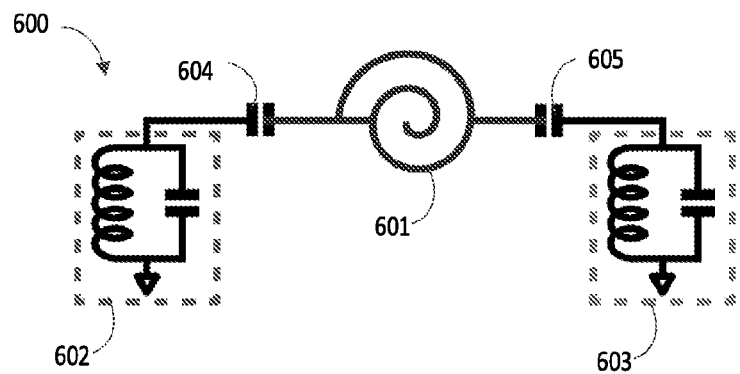
FIG. 6 is a schematic diagram of a tunable coupler based on a SNAIL between two cavities, according to some embodiments.

In some embodiments, any of the above examples of a SNAIL may be used to tunably couple two cavities together in a Kerr-free manner. FIG. 6 illustrates a superconducting circuit 600 that includes a SNAIL 601, a first cavity 602, and a second cavity 603. The SNAIL 601 is connected to both cavities 602 and 603. In some embodiments, coupling capacitor 604 couples the SNAIL 601 to the first cavity 602 and coupling capacitor 605 couples the SNAIL 601 to the second cavity 603.

In some embodiments, the first cavity 602 supports a mode of a first frequency and the second cavity 603 supports a mode of a second frequency that is different from the first frequency. When the SNAIL 601 is pumped at the difference frequency between the first and second frequency, the effective interaction $g_{eff}(t)(a_1^\dagger a_2 + a_2^\dagger a_1)$, where $a_1$ and $a_2$ are the annihilation operators of the first and second cavity, respectively. The ability to tunably couple two non-degenerate cavities without a self-Kerr or cross-Kerr term may have many applications in quantum information processing systems.

In some embodiments, a SNAIL and/or a superconducting device, such as an amplifier, that uses one or more SNAILs may be included on an integrated circuit (chip).

Figure 7:
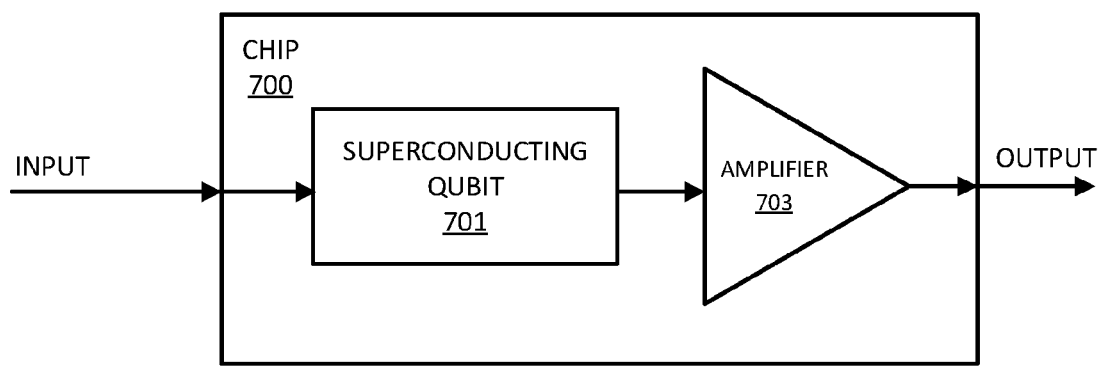
FIG. 7 is a schematic diagram of an integrated circuit according to some embodiments.

FIG. 7 shows a schematic of an integrated circuit (chip 700) according to some embodiments. The chip comprises at least one superconducting qubit 701 and at least one amplifier 703. A single chip 700 may include a plurality of superconducting qubits 701 and a plurality of amplifiers 703. Each amplifier of the plurality of amplifiers is connected to at least one superconducting qubit 701. The chip 700 may include microwave circuitry that connects the plurality of superconducting qubits together such that two or more superconducting qubits may interact with one another. Interactions between superconducting qubits may be used, for example, to implement quantum gates and/or entangle two or more superconducting qubits 701.

The chip 700 may receive input microwave signals from at least one control circuit. The at least one control circuit may provide microwave signals to control the qubit 701 and/or the amplifier 703. For example, the control circuit may send microwave signals to the qubit 101 that implement one or more quantum control gates. The control circuit may also transmit the pump microwaves for use in driving one or more parametric amplifiers in the amplifier 703. In some embodiments, the at least one control circuit may include one or more additional low-noise directional amplifiers. However, any suitable control electronics may be used.

In some embodiments, the chip 700 has at least one output port for outputting amplified microwave signals from the amplifier 703. The output signals may be directed to additional amplifiers and/or detection electronics used to record the measured values of the state of the superconducting qubit 701. Any suitable detection electronics may be used.

The superconducting qubit 701 may be any suitable device comprising at least one Josephson junction. For example, the superconducting qubit 701 may be a charge qubit, a flux qubit, a phase qubit, or a transmon qubit. In some embodiments, the superconducting qubit 701 may include at least one Josephson junction inside a microwave resonator. The resonator may be, for example, a strip line resonator or a three-dimensional cavity.

The amplifier 703 may be, for example, a low-noise directional amplifier that is cable of being integrated into chip 700 and is non-reciprocal so as to reduce noise feedback reaching the superconducting qubit 701. Embodiments of low-noise directional amplifiers are discussed in more detail below.

In some embodiments, the entire chip 700 is held at low temperature to reduce noise and to maintain the superconductor below its critical temperature. For example, the chip 700 may be held in a dilution refrigerator at temperatures on the order of tens to hundreds of millikelvin. In some embodiments, the temperature of the chip 700 may be maintained at approximately 10 millikelvin (10 milli-degrees above absolute zero) such that thermal noise is reduced and is not capable of destroying the quantum information stored in the qubit 701 and amplified by the amplifier 703. The temperature of the chip 700 may be held at these low temperatures using cryogenic techniques known in the art. For example, a dilution refrigerator using liquid Helium may be used to cool the chip 700 to the selected temperature.

Figure 8:
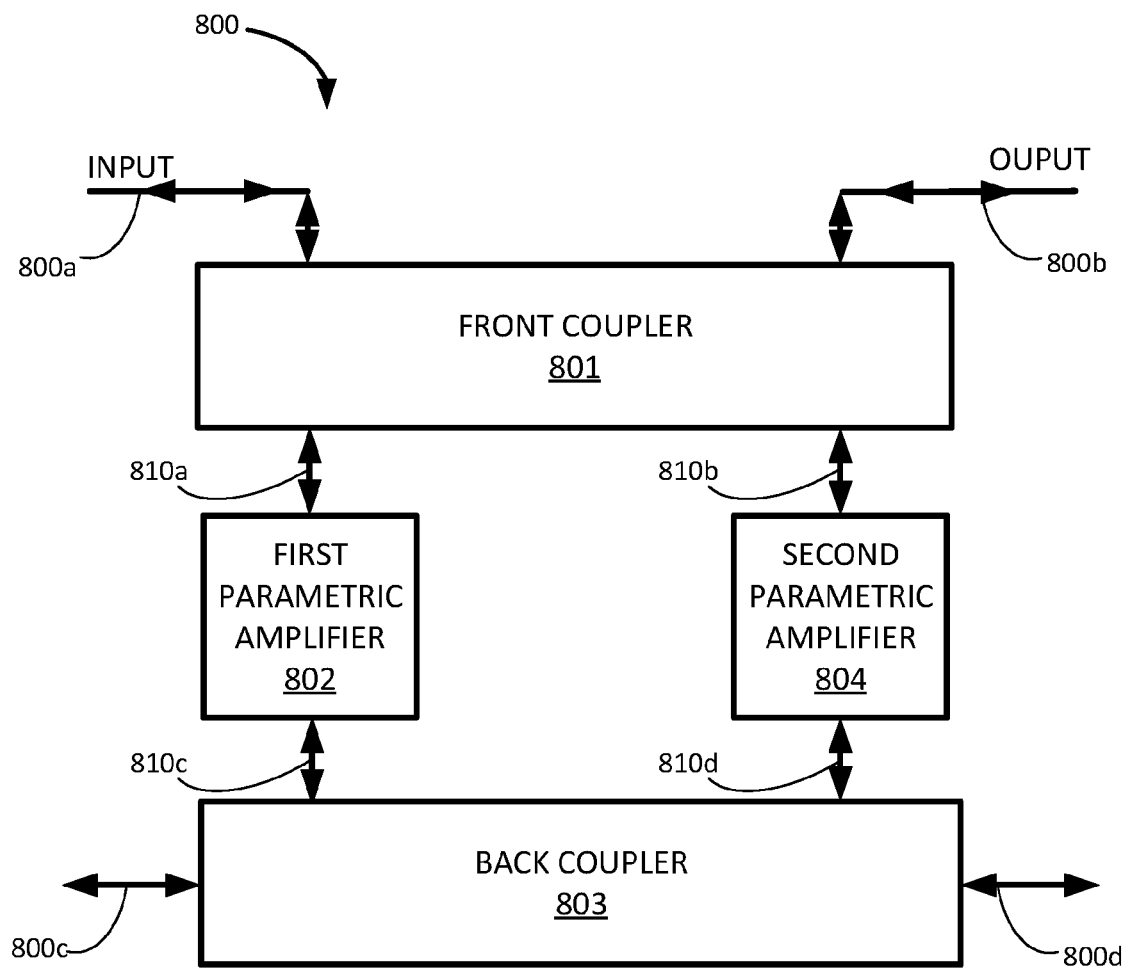
FIG. 8 is a schematic diagram a parametric amplifier, according to some embodiments.

FIG. 8 illustrates a low-noise directional amplifier 800 according to some embodiments. The directional amplifier 800 has at least two external ports that may be used to connect to external devices, such as qubit 701—a first port 800a acting as an input port, and a second port 800b acting as an output port. Additional external ports may also be used. For example, in the embodiment shown in FIG. 8, two additional "cold load" ports, port 800c and port 800d are part of the device. However, ports 800c and 800d are not used to send or receive signals—they are connected to "cold loads" in that the loads connected to those ports are kept at millikelvin temperatures. The directional amplifier 800 may also include internal ports for connecting a first component of the directional amplifier 800 to a second component of the directional amplifier. For example, port 810a connects a front coupler 801 to a first parametric amplifier 802, port 810b connects the front coupler 801 to a second parametric amplifier 804, port 210c connects the first parametric amplifier 802 to a back coupler 803, and port 810d connects the second parametric amplifier to the back coupler 803. The adjective "front" refers to the fact that the front coupler 801 provides the two external ports (an input port 800a and an output port 800b) that connect the directional amplifier 800 to external components. The adjective "back" refers to the fact that the back coupler 803 does not connect to any external components that send a signal to or receive a signal from the directional amplifier 803.

The embodiment of directional amplifier 800 shown in FIG. 8 comprises four main components: a first coupler 801 (referred to as a front coupler), a second coupler 803 (referred to as a back coupler), a first parametric amplifier 802 and a second parametric amplifier 804. In some embodiments, the front coupler 801 is a symmetric coupler that acts like a beam splitter for microwave input signals. For example, front coupler 801 includes the input port 800a that is configured to receive the signal to be amplified, and may transmit or reflect an input signal to the ports 810a and 810b, respectively. Similarly, while output port 800b is configured to output the amplified signal, a signal representing noise and/or reflections from external components subsequent to the directional amplifier 800 may be received by the directional amplifier 800 via output port 800b and may be transmitted or reflected to ports 810b and 810a, respectively. Based on reciprocity, it is also possible that any signal received by ports 810a and 810b from other portions of the directional amplifier 800 can transmit or reflect the signal out either input port 800a or output port 800b. Some embodiments are configured such that, for the entire system of the directional amplifier 800 receiving a signal via input port 800a, the probability amplitude of a signal being output via input port 800a is substantially equal to zero. This reduction of the probability amplitude reduces feedback to the system being measured/amplified by the directional amplifier 800 (e.g., qubit 701).

The couplers 801 and 803 may have any suitable transmission and reflection amplitudes. For example, for a signal incoming to port 800a of the front coupler 801, the "transmission amplitude" of the front coupler 801 represents the probability amplitude that the signal will leave via internal port 810a, and the "reflection amplitude" of the front coupler 801 represents the probability amplitude that the signal will leave via internal port 810b. In some embodiments, the front coupler 801 and the back coupler 803 may be symmetric couplers, meaning the amplitude of the transmission and reflection amplitudes are equal. For example, the transmission amplitude for a signal incoming to input port 1 of the front coupler 801 may be 1/sqrt(2) and the reflection amplitude for a signal incoming to input port 1 of the front coupler 801 may be i/sqrt(2), where i=sqrt(−1). The back coupler 803 is may have arbitrary transmission amplitude α and arbitrary reflection amplitude iβ, where α and β are both real numbers. In some embodiments, the back coupler 803 may also be a symmetric coupler such that α=β=1/sqrt(2). Symmetric couplers are sometimes referred to as 3 dB couplers. However, embodiments are not limited to any particular transmission or reflection amplitudes for the front coupler 801 and the back coupler 803. The back coupler 803 may be implements in any suitable way. For example, the back coupler may be used to introduce a lossy channel between the first parametric amplifier 802 and the second parametric amplifier 804, in which case a lossy microwave transmission connection may be used instead of a hybrid coupler.

The parametric amplifiers 802 and 804 may be a parametric amplifier that includes at least one SNAIL. For example, in some embodiments, the parametric converter 300 described in connection with FIGS. 3A-B may be used.

The parametric converter 300 is an example of a non-degenerate phase-preserving amplifier based on a ring of SNAILs. The two parametric amplifiers 202 and 204 utilize a coherent pump signal to perform the amplification via three-wave mixing. In some embodiments, the phase of the pump for each amplifier may be unequal, but held at a constant relationship with each other. For example, the difference between the two pump phases may be held constant, represented by the formula: $\Delta\varphi = \varphi_1 - \varphi_2 = C$, where $\Delta\varphi$ is the difference between the pump phase $\varphi_1$ of the first amplifier 802 and the pump phase of the second amplifier $\varphi_2$ of the second amplifier 804. In some embodiments, $\Delta\varphi = \pi/2$, which increases the forward gain of the amplifier 800. In some embodiments, the reflection coefficient for the overall device may be tuned to be substantially zero so that components, such as qubit 701, are not disturbed by reflections from directional amplifier 800. In other embodiments, the phase may be tuned such that a reverse gain through the directional amplifier 800 is negligible at the expense of having a non-zero reflection coefficient. Such an embodiment may be useful in application where reducing the reverse gain is important and where the corresponding non-zero reflection coefficient will not create problems for other components of the system.

Figure 9A:
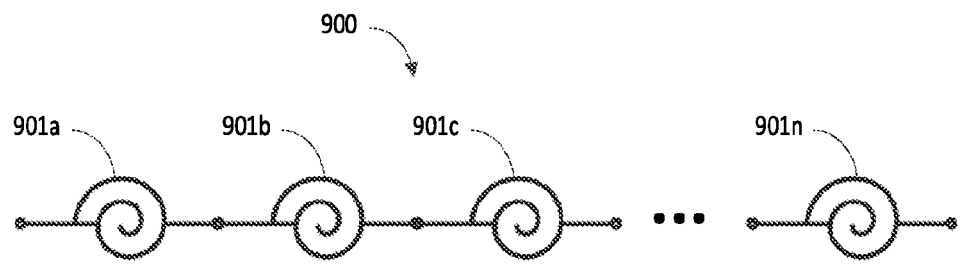
FIG. 9A is a schematic diagram of multiple SNAILs coupled in series, according to some embodiments.

In any of the above embodiments, a single SNAIL may be replaced by a plurality of SNAILs connected in series. FIG. 9A illustrates a superconducting circuit 900 that includes n individual SNAILs 901 connected in series. This arrangement is simple to create because each SNAIL 901 has two nodes and one node of each SNAIL simply connects to one node of the subsequent SNAIL. The superconducting circuit 900 increases the dynamic range and/or bandwidth relative to using a single SNAIL. Thus, in any of the above embodiments, any place where a single SNAIL is shown may be replaced with the superconducting circuit 900.

Figure 9B:
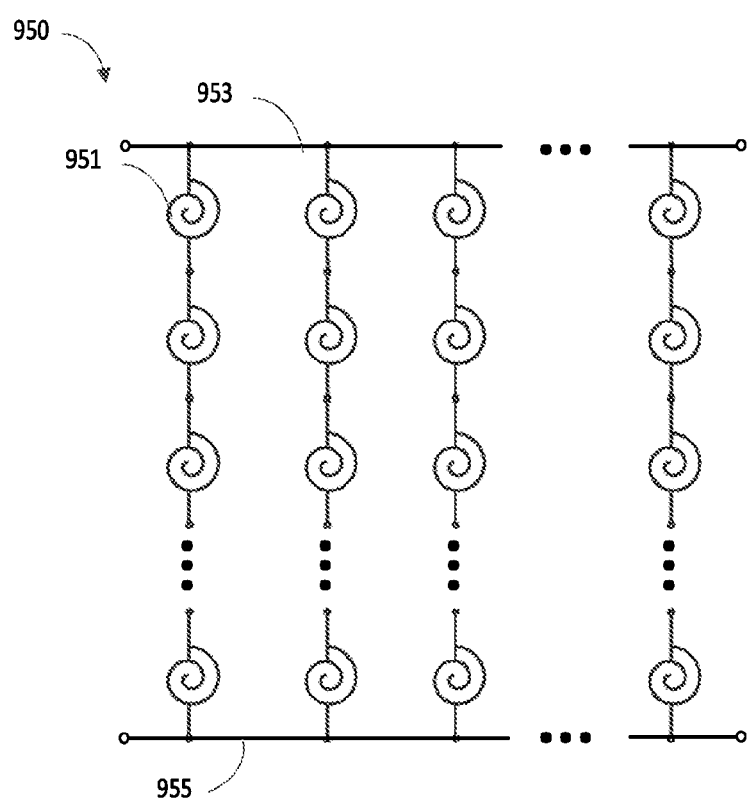
FIG. 9B is a schematic diagram of multiple tessellated SNAILs of the type shown in FIG. 1A, according to some embodiments.

The above concept of replacing a single SNAIL with a series of SNAILS may be further extended to the concept to tessellated SNAILS. FIG. 9B is a schematic of a superconducting circuit 950 that includes multiple SNAILS 951 in a tessellated pattern. In some embodiments, there are multiple columns of SNAIL 951 connected in series between a first conductor 953 and a second conductor 955. In some embodiments, each column of SNAILs is connected in parallel with each other column of SNAILs. The dipole nature of the SNAIL allows for the tessellation of a three-wave mixing amplifier.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A superconducting device comprising:
   two nodes; and
   a Josephson junction coupled between the two nodes, wherein the Josephson junction is characterized by a superconducting phase difference, $\varphi$ wherein the superconducting device has a potential that varies as a function of the superconducting phase difference, $\varphi$ and has a single potential well, wherein the potential has a non-zero $\varphi^3$ term and a $\varphi^4$ term that is equal to zero.

2. The superconducting device of claim 1, wherein the Josephson junction is a first Josephson junction and the superconducting device further comprises:
   a superconducting ring connected between the two nodes, the superconducting ring comprising:
      a first ring portion comprising a plurality of second Josephson junctions connected in series, wherein each second Josephson junction of the plurality of second Josephson junctions has the same tunneling energy; and
      a second ring portion comprising the first Josephson junction in parallel with the plurality of second Josephson junctions between the two nodes.

3. The superconducting device of claim 2, further comprising a magnetic flux generation device positioned in proximity to the superconducting ring and configured to generate an external DC magnetic flux through the superconducting ring.

4. The superconducting device of claim 3, wherein the plurality of second Josephson junctions consists of three second Josephson junctions.

5. The superconducting device of claim 4, wherein the three second Josephson junctions are formed from two Dolan bridges.

6. The superconducting device of claim 4, wherein a tunneling energy of the first Josephson junction is less than a tunneling energy of each of the second Josephson junctions.

7. The superconducting device of claim 6, wherein the tunneling energy of each second Josephson junction is $E_J$, and the tunneling energy of the first Josephson junction is $\alpha E_J$, where $\alpha$ is less than 0.50 and greater than 0.20.

8. The superconducting device of claim 7, wherein $\alpha$ is approximately equal to 0.29 and the external DC magnetic flux is $0.41\Phi_0$, where $\Phi_0$ is the magnetic flux quantum.

* * * * *

UNITED STATES PATENT AND TRADEMARK OFFICE
CERTIFICATE OF CORRECTION

PATENT NO. : 11,737,376 B2
APPLICATION NO. : 16/770942
DATED : August 22, 2023
INVENTOR(S) : Nicholas Frattini et al.

It is certified that error appears in the above-identified patent and that said Letters Patent is hereby corrected as shown below:

In the Claims

At Column 16, Line 19, Claim 1:
"superconducting phase difference, $\varphi$ wherein the superconducting"

Should read:
--superconducting phase difference, $\varphi$, wherein the superconducting--

At Column 16, Line 21, Claim 1:
"function of the superconducting phase difference, $\varphi$ and"

Should read:
--function of the superconducting phase difference, $\varphi$, and--

At Column 16, Line 58, Claim 8:
"flux is $0.41\Phi_0$, where ( $\Phi_0$ is the magnetic flux quantum."

Should read:
--flux is $0.41\Phi_0$, where $\Phi_0$ is the magnetic flux quantum.--

Signed and Sealed this
Twenty-first Day of November, 2023

Katherine Kelly Vidal
*Director of the United States Patent and Trademark Office*